United States Patent
Pyo

(10) Patent No.: US 12,205,498 B2
(45) Date of Patent: Jan. 21, 2025

(54) DISPLAY DEVICE

(71) Applicant: LG ELECTRONICS INC., Seoul (KR)

(72) Inventor: Jonggil Pyo, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 198 days.

(21) Appl. No.: 17/801,730

(22) PCT Filed: Feb. 27, 2020

(86) PCT No.: PCT/KR2020/002847
§ 371 (c)(1),
(2) Date: Aug. 23, 2022

(87) PCT Pub. No.: WO2021/172626
PCT Pub. Date: Sep. 2, 2021

(65) Prior Publication Data
US 2023/0083552 A1    Mar. 16, 2023

(51) Int. Cl.
*G06F 1/16* (2006.01)
*G09F 9/30* (2006.01)

(52) U.S. Cl.
CPC .................... *G09F 9/301* (2013.01)

(58) Field of Classification Search
CPC ............ G09F 9/301; G06F 2200/1612; G06F 1/1601; G06F 1/1652; B65H 75/44; H10K 99/00
See application file for complete search history.

(56) References Cited

U.S. PATENT DOCUMENTS

| | | | | |
|---|---|---|---|---|
| 8,199,471 | B2* | 6/2012 | Bemelmans | G09F 9/30 |
| | | | | 455/462 |
| 8,711,566 | B2* | 4/2014 | O'Brien | G06F 1/1652 |
| | | | | 361/724 |
| 10,194,543 | B2* | 1/2019 | Seo | G06F 1/1626 |
| 10,534,402 | B1* | 1/2020 | Kim | H05K 1/118 |
| 11,029,733 | B2* | 6/2021 | Lee | G06F 1/1652 |
| 11,353,926 | B2* | 6/2022 | Kim | G06F 1/1652 |

(Continued)

FOREIGN PATENT DOCUMENTS

| | | |
|---|---|---|
| JP | 2016-179743 | 10/2016 |
| KR | 10-2016-0059372 | 5/2016 |

(Continued)

OTHER PUBLICATIONS

PCT International Application No. PCT/KR2020/002847, International Search Report dated Dec. 17, 2020, 4 pages.

*Primary Examiner* — Rockshana D Chowdhury
(74) *Attorney, Agent, or Firm* — LEE, HONG, DEGERMAN, KANG & WAIMEY

(57) ABSTRACT

A display device is disclosed. The display device of the present disclosure may comprise: a flexible display panel; a roller which elongates and on or from which the display panel is wound or unwound; a first frame to which one end of the roller is rotatably coupled; a second frame to which the other end of the roller is rotatably coupled and faces the first frame with respect to the roller; and a door assembly which is positioned to be adjacent to the distal end of the display panel unwound from the roller, and is pivotably connected to the first frame and the second frame.

10 Claims, 47 Drawing Sheets

(56) References Cited

U.S. PATENT DOCUMENTS

| | | | | |
|---|---|---|---|---|
| 11,521,521 B2* | 12/2022 | Chung | ............... | G09F 11/21 |
| 11,531,375 B2* | 12/2022 | Cho | ............... | H04M 1/0268 |
| 11,576,270 B2* | 2/2023 | Rha | ............... | G06F 1/1652 |
| 2010/0177020 A1* | 7/2010 | Bemelmans | ............... | G09F 9/00 |
| | | | | 345/55 |
| 2015/0116921 A1* | 4/2015 | Hsu | ............... | G06F 1/1624 |
| | | | | 361/679.27 |
| 2016/0187929 A1* | 6/2016 | Kim | ............... | G06F 1/1643 |
| | | | | 345/184 |
| 2016/0216737 A1* | 7/2016 | Hayk | ............... | G06F 1/1626 |
| 2022/0262281 A1* | 8/2022 | Kim | ............... | G09F 9/301 |

FOREIGN PATENT DOCUMENTS

| | | |
|---|---|---|
| KR | 10-2019-0083687 | 7/2019 |
| KR | 10-2019-0111346 | 10/2019 |
| KR | 10-2020-0013549 | 2/2020 |

* cited by examiner

DISPLAY DEVICE

CROSS-REFERENCE TO RELATED APPLICATIONS

This application is the National Stage filing under 35 U.S.C. 371 of International Application No. PCT/KR2020/002847, filed on Feb. 27, 2020, the contents of which are hereby incorporated by reference herein its entirety.

TECHNICAL FIELD

The present disclosure relates to a display device.

BACKGROUND ART

As the information society develops, the demand for display devices is also increasing in various forms. In response to this, various display devices such as Liquid Crystal Display Device (LCD), Plasma Display Panel (PDP), Electroluminescent Display (ELD), and Vacuum Fluorescent Display (VFD) have been researched and used in recent years.

Among them, a display device using an organic light emitting diode (OLED) has superior luminance characteristics and viewing angle characteristics compared to a liquid crystal display device, and can be implemented in an ultra-thin shape as it does not require a backlight unit.

In addition, a flexible display panel can be bent or wound around a roller. By using the flexible display panel, it is possible to implement a display device that is roll out from a roller or wound around a roller. A lot of research has been accomplished on a structure for winding or unwinding a flexible display panel on/from a roller.

DISCLOSURE

Technical Problem

An object of the present disclosure is to solve the above and other problems.

Another object of the present disclosure may be to secure structural rigidity to prevent sagging of a display device.

Another object of the present disclosure may be to secure structural rigidity to prevent torsion of a display device.

Another object of the present disclosure may be to provide a door opening-closing structure of a display device.

Another object of the present disclosure may be to provide a structure that prevents the door of a display device from sagging.

Technical Solution

According to an aspect of the present disclosure for achieving the above object, there is provided a display device including: a flexible display panel; a roller which extends long, and around which the display panel is wound, or from which the display panel is unwound; a first frame to which one end of the roller is rotatably coupled; a second frame to which the other end of the roller is rotatably coupled, and which faces the first frame with respect to the roller; and a door assembly which is located adjacent to a distal end of the display panel unwound from the roller, and is pivotally connected to the first frame and the second frame.

Advantageous Effects

The effect of the display device according to the present disclosure will be described as follows.

According to at least one of embodiments of the present disclosure, structural rigidity for preventing the display device from sagging may be secured.

According to at least one of embodiments of the present disclosure, structural rigidity for preventing torsion of the display device may be secured.

According to at least one of embodiments of the present disclosure, a door opening-closing structure of a display device may be provided.

According to at least one of the embodiments of the present disclosure, a structure that prevents the door of a display device from sagging may be provided.

Further scope of applicability of the present disclosure will become apparent from the following detailed description. However, it should be understood that the detailed description and specific embodiments such as preferred embodiments of the present disclosure are given by way of example only, since various changes and modifications within the spirit and scope of the present disclosure may be clearly understood by those skilled in the art.

MODE FOR INVENTION

Figure 1:
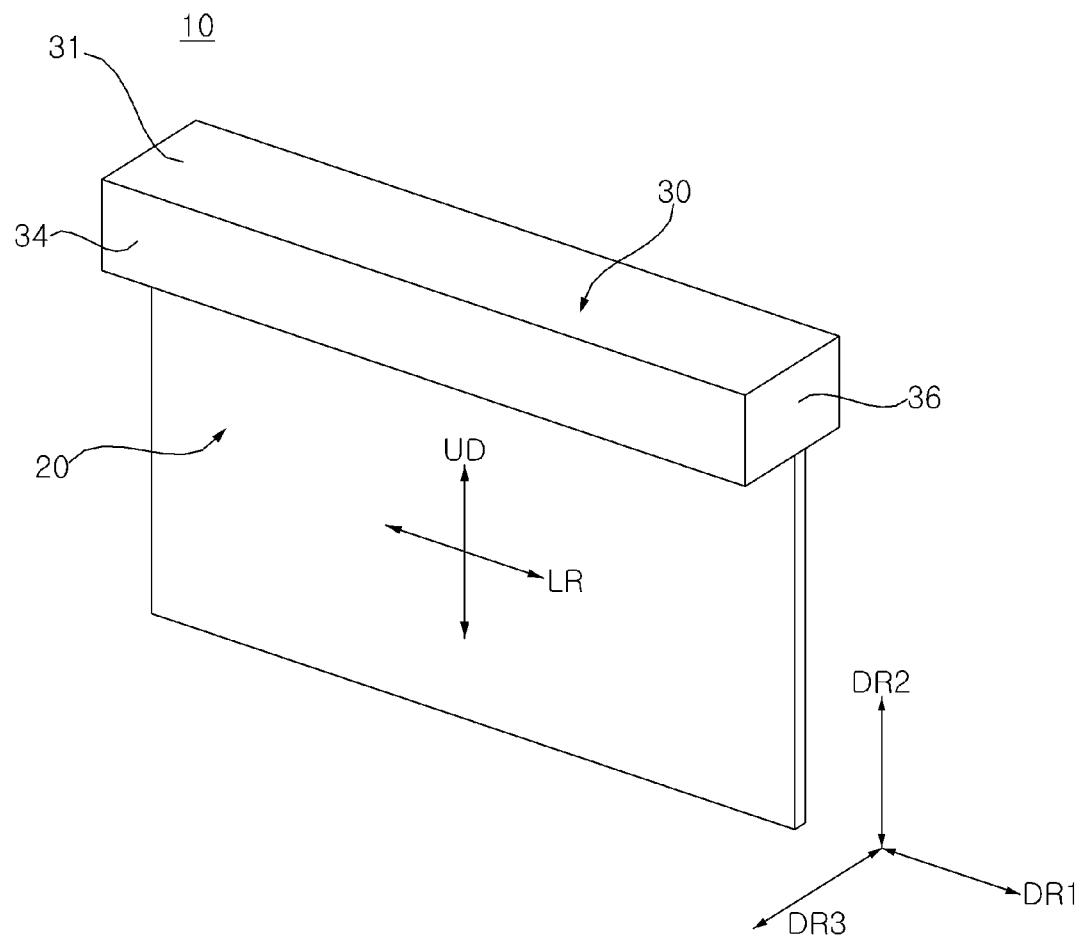
FIGS. 1 to 47 are diagrams illustrating examples of a display device according to embodiments of the present disclosure.

Description will now be given in detail according to exemplary embodiments disclosed herein, with reference to the accompanying drawings. For the sake of brief description with reference to the drawings, the same or equivalent components may be denoted by the same reference numbers, and description thereof will not be repeated.

In general, suffixes such as "module" and "unit" may be used to refer to elements or components. Use of such suffixes herein is merely intended to facilitate description of the specification, and the suffixes do not have any special meaning or function.

In the present disclosure, that which is well known to one of ordinary skill in the relevant art has generally been omitted for the sake of brevity. The accompanying drawings are used to assist in easy understanding of various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are only used to distinguish one element from another.

It will be understood that when an element is referred to as being "connected with" another element, there may be intervening elements present. In contrast, it will be understood that when an element is referred to as being "directly connected with" another element, there are no intervening elements present.

A singular representation may include a plural representation unless context clearly indicates otherwise.

In the following description, even if the embodiment is described with reference to specific drawings, if necessary, reference numerals not appearing in the specific drawings may be referred to, and reference numerals not appearing in the specific drawings are used in a case where the above reference numerals appear in the other figures.

Referring to FIG. 1, a display device 10 may include a display unit 20 and a housing 30. The housing 30 may have an internal space. At least a portion of the display unit 20 may be located inside the housing 30. At least a portion of the display unit 20 may be located outside the housing 30. The display unit 20 may display a screen.

A direction parallel to the length direction of the housing 30 may be referred to as a first direction DR1, a left direction, or a right direction. A direction in which the display unit 20 displays a screen may be referred to as a front side direction, or a forward direction. A direction opposite to the direction in which the display unit 20 displays a screen may be referred to as a-z axis, a rear side direction, or a rearward direction. A direction parallel to a height direction of the display device 10 may be referred to as a second direction DR2, an upper direction, or a lower direction.

A third direction DR3 may be a direction perpendicular to the first direction DR1 and/or the second direction DR2. The first direction DR1 and the second direction DR2 may be collectively referred to as a horizontal direction. In addition, the third direction DR3 may be referred to as a vertical direction. The left-right direction LR may be parallel to the first direction DR1, and the up-down direction UD may be parallel to the second direction DR2.

Figure 2:
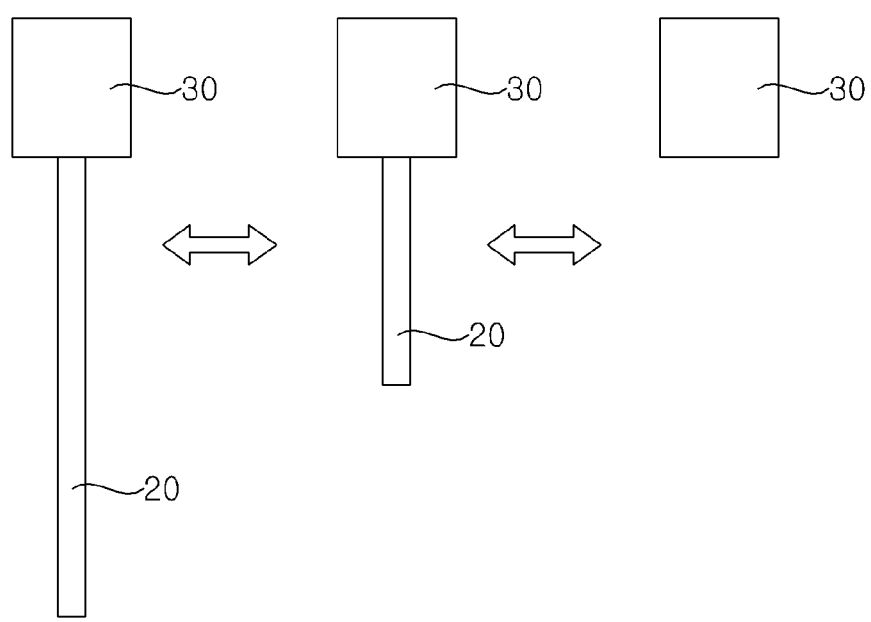

Referring to FIG. 2, the entire display unit 20 may be located inside the housing 30. At least a portion of the display unit 20 may be located outside the housing 30. The extent to which the display unit 20 is exposed to the outside of the housing 30 may be adjusted as necessary.

Figure 3:
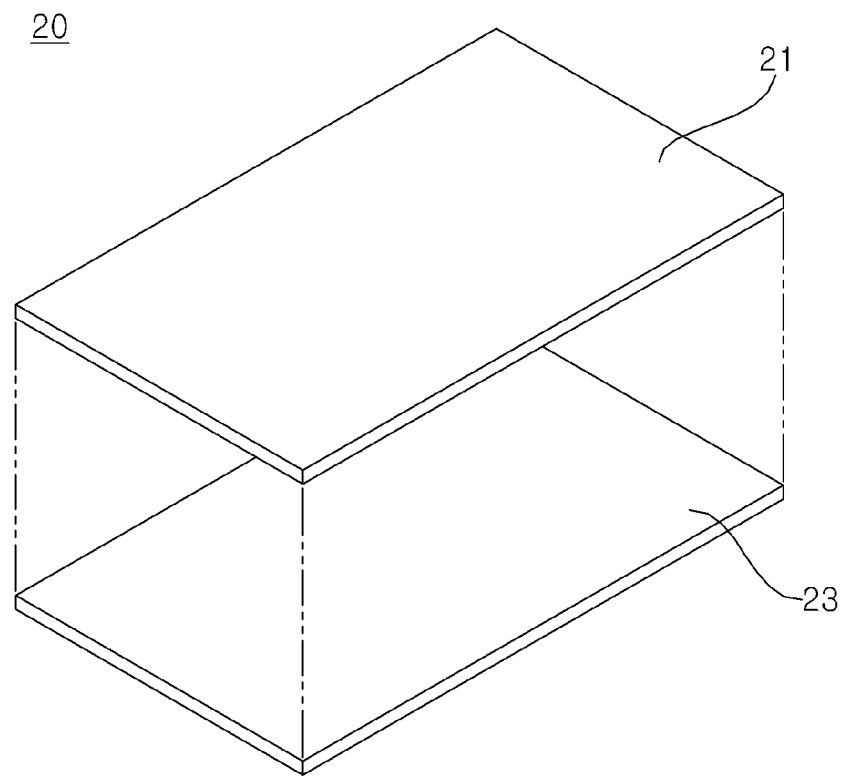

Referring to FIG. 3, the display unit 20 may include a display panel 21 and a plate 23. The display panel 21 may be flexible. For example, the display panel 21 may be an organic light emitting display (OLED).

The display panel 21 may have a front surface for displaying an image. The display panel 21 may have a rear surface opposite to the front surface. The front surface of the display panel 21 may be covered with a light-transmitting material. For example, the light-transmitting material may be a synthetic resin or a film.

The plate 23 may be coupled, fastened, or attached to the rear surface of the display panel 21. The plate 23 may include a metal material. The plate 23 may be referred to as a module cover 23, a cover 23, a display panel cover 23, a panel cover 23, or an apron 23.

Figure 4:
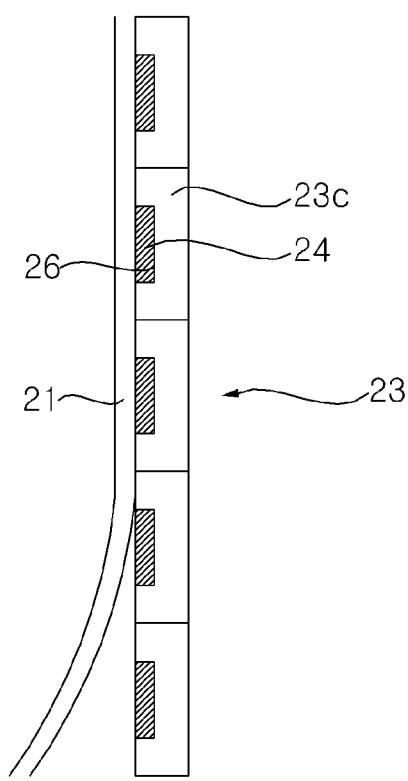

Referring to FIG. 4, the plate 23 may include a plurality of segments 23c. A magnet 24 may be located inside a recess 26 of the segment 23c. The recess 26 may be located on a surface of the segment 23c facing the display panel 21. The recess 26 may be located in the front surface of each segment 23c. Since the magnet 24 is received inside the recess 26, the magnet 24 may not protrude out of the segment 23c. The display panel 21 may be flat without being crumpled even when it comes into contact with the segment 23c.

Figure 5:
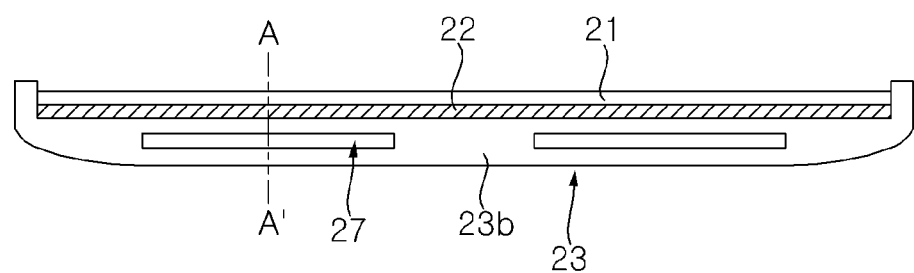
Figure 5:
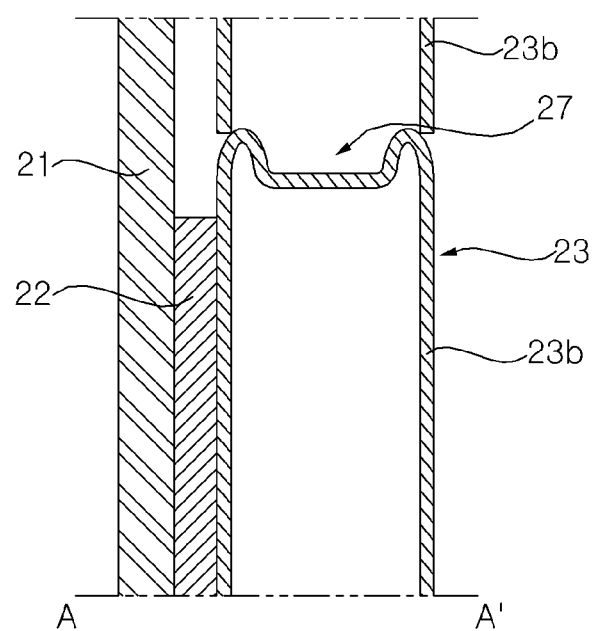

Referring to FIG. 5, a bead 27 may be formed on the upper surface of the segment 23b. The bead 27 may have a shape recessed to the inside of the segment 23b. For example, the bead 27 may be formed by pressing the segment 23b. A plurality of beads 27 may be formed in the segment 23b. The plurality of beads 27 may be spaced apart from each other. The bead 27 may improve the rigidity of the segment 23b. The bead 27 may prevent the shape of the segment 23b from being deformed from an external impact. The segment 23b may be fixed to the rearward direction of the display panel 21 by an adhesive member 22. For example, the adhesive member 22 may be a double-sided tape.

Figure 6:
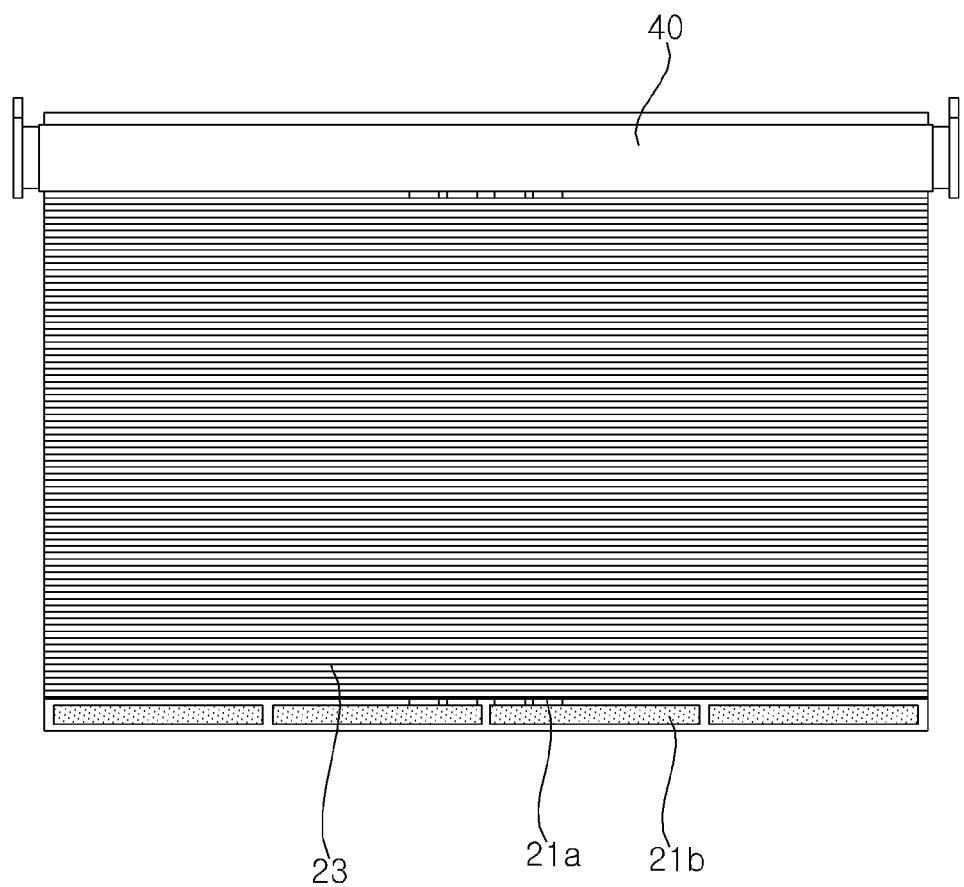

Referring to FIG. 6, a source PCB 21b may be located in the lower side of the module cover 23. When the source PCB 21b is rolled down or rolled up, its position may change with the movement of the module cover 23. A FFC cable 21a may be located in the center of the module cover 23 based on a first direction. The FFC cable 21a may be located in opposite ends of the module cover 23 based on the first direction.

Figure 7:
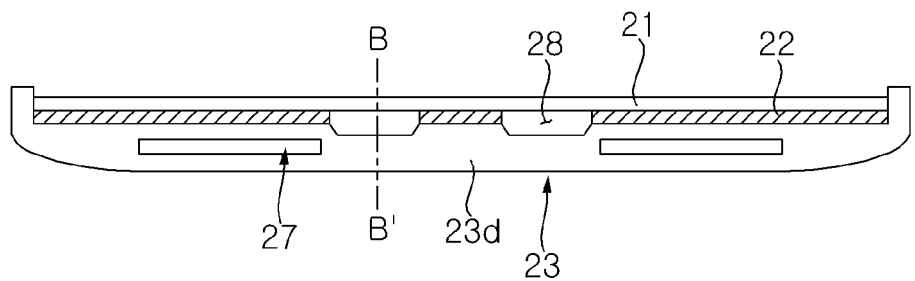
Figure 7:
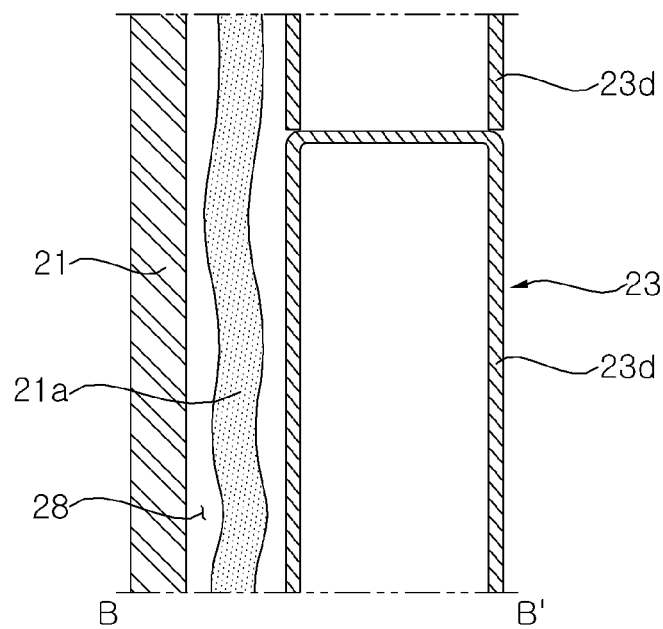

Referring to FIG. 7, the segment 23d may include a recess portion 28 recessed to the inside of the segment 23d. The recess portion 28 may form a space between the display panel 21 and the module cover 23. The FFC cable 21a may be received in the space formed by the recess portion 28. In addition, the recess portion 28 may improve the rigidity of the segment 23d. The bead 27 may be located on the segment 23d excluding a portion where the recess portion 28 is located. The position of the recess portion 28 may not overlap with the position of the bead 27 to prevent the segment 23d from weakening.

Figure 8:
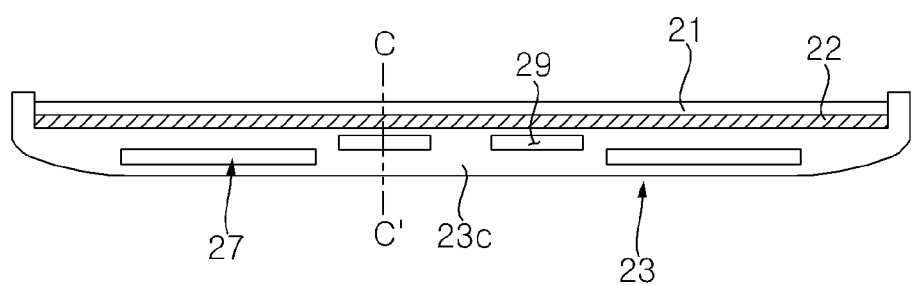
Figure 8:
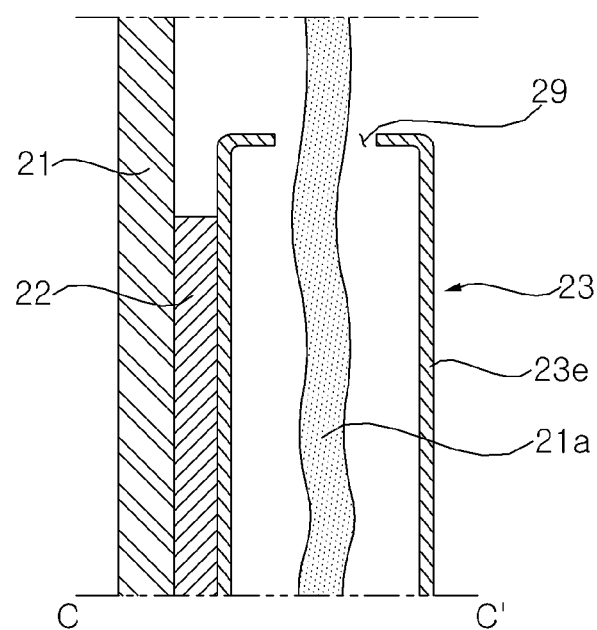

Referring to FIG. 8, in the segment 23e, a penetrating portion 29 may be located in a central portion of the segment 23e based on the first direction. The penetrating portion 29 may penetrate the central portion of the segment 23e in the second direction. That is, the penetrating portion 29 may be a hole located in the segment 23e. The penetrating portion 29 may be a portion in which the FFC cable 21a is located. Since the penetrating portion 29 is formed in the segment 23e, the thickness of the segment 23e can be reduced in comparison with a case where the FFC cable 21a is located in the recess portion 28 (refer to FIG. 7). The bead 27 may be located in the segment 23e excluding a portion where the penetrating portion 29 is located. The position of the penetrating portion 29 may not overlap the position of the bead 27 in order to prevent the segment 23e from weakening.

Figure 9:
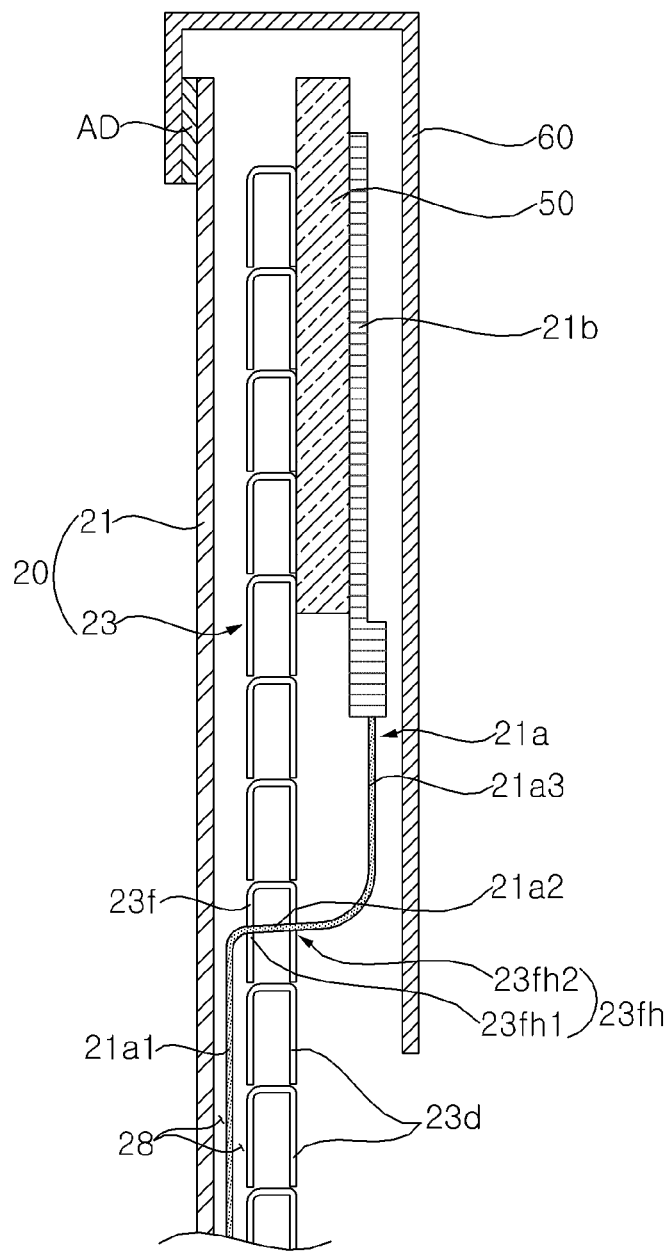

Referring to FIG. 9, a top case 60 may cover the display panel 21 and the module cover 23 as well as the source PCB 21b and an upper bar 50. One surface of the upper bar 50 may be coupled to the rear surface of the module cover 23, and the other surface may be coupled to the source PCB 21b. The upper bar 50 may be fixed to the module cover 23 to support the source PCB 21b.

Figure 10:
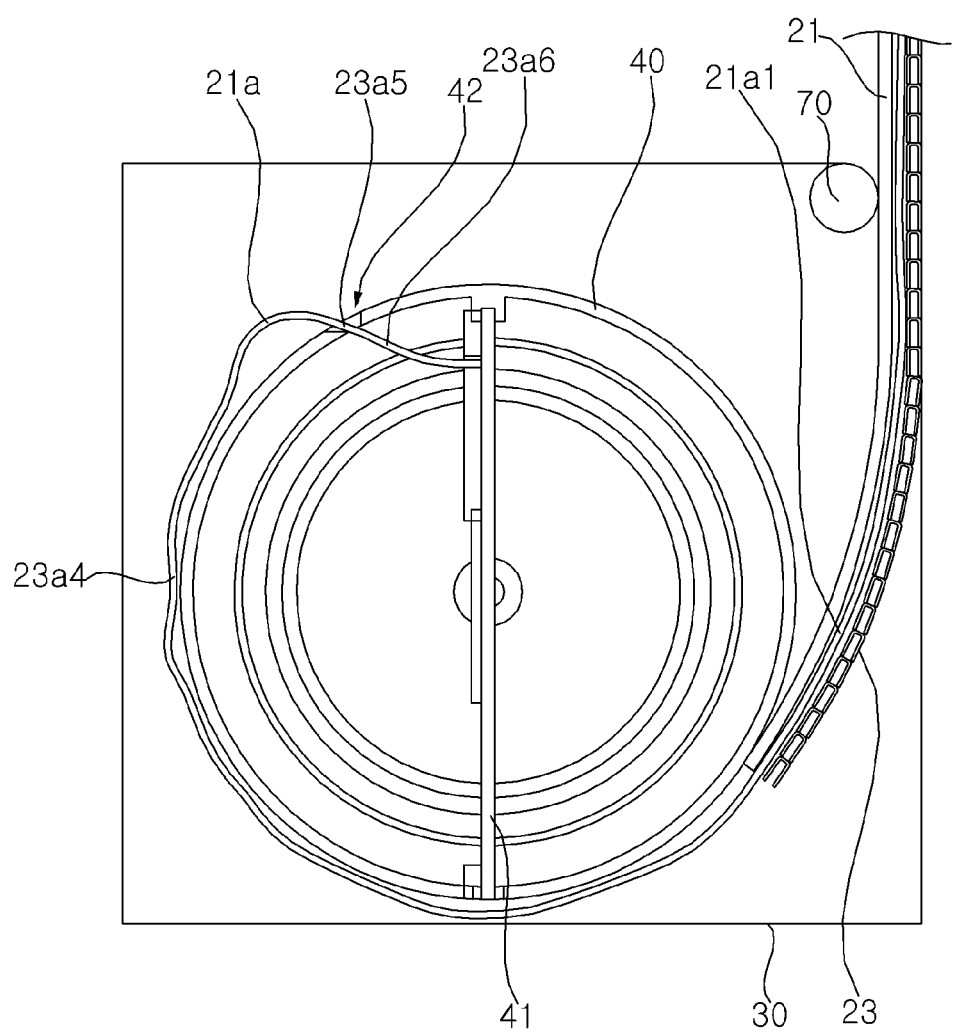

The lower end of the FFC cable 21a may be connected to a timing controller board 41 (refer to FIG. 10) inside a panel roller 40 (refer to FIG. 10). The FFC cable 21a may be wound around or unwound from the panel roller 40 together with the display unit 20.

A portion of the FFC cable 21a may be located between the display panel 21 and the module cover 23. A portion of the FFC cable 21a located between the display panel 21 and the module cover 23 may be referred to as a first portion 21a1. The first portion 21a1 may be located in the recess portion 28 formed by the plurality of segments 23d. Alternatively, the first portion 21a1 may be received in the recess portion 28 formed by the plurality of segments 23d.

A portion of the FFC cable 21a may penetrate the segment 23f. A portion of the FFC cable 21a that penetrates the segment 23f may be referred to as a second portion 21a2. The segment 23f may include a first hole 23th1 formed on the front surface and a second hole 23fh2 formed on the rear surface. The first hole 23th1 and the second hole 23th2 may be interconnected to form one hole 23th. The hole 23th may penetrate the segment 23f in a third direction. The second portion 21a2 may pass through the hole 23fh. The hole 23fh may be referred to as a connection hole 23th.

An upper end of the FFC cable 21a may be electrically connected to the source PCB 21b. A portion of the FFC cable 21a may be located on the rear surface of the module cover 23. A portion of the FFC cable 21a located on the rear surface of the module cover 23 may be referred to as a third portion 21a3. The third portion 21a3 may be electrically connected to the source PCB 21b.

The third portion 21a3 may be covered by the top case 60. Accordingly, the third portion 21a3 may not be exposed to the outside.

Referring to FIG. 10, the FFC cable 21a may be connected to the timing controller board 41 mounted on the panel roller 40. A through hole 42 may be formed in the panel roller 40, and the FFC cable 21a may be connected to the timing controller board 41 through the through hole 42.

The through hole 42 may be located in one side of the panel roller 40 and may penetrate the outer circumferential portion of the panel roller 40. The FFC cable 21a may be connected to one side of the timing controller board 41 through the through hole 42.

Even if the FFC cable 21a is located on the outer perimeter of the panel roller 40, the connection to the timing controller board 41 may be maintained due to the through hole 42. Accordingly, the FFC cable 21a may not be twisted by rotating together with the panel roller 40.

A portion of the FFC cable 21a may be wound around the panel roller 40. A portion of the FFC cable 21a wound around the panel roller 40 may be referred to as a fourth portion 23a4. The fourth portion 23a4 may be in contact with the outer circumferential surface of the panel roller 40.

A portion of the FFC cable 21a may pass through the through hole 42. A portion of the FFC cable 21a passing through the through hole 42 may be referred to as a fifth portion 23a5.

A lower end of the FFC cable 21a may be electrically connected to the timing controller board 41. A portion of the FFC cable 21a may be located inside the panel roller 40. A portion of the FFC cable 21a located inside the panel roller 40 may be referred to as a sixth portion 23a6. The sixth portion 23a6 may be electrically connected to the timing controller board 41.

Figure 11:
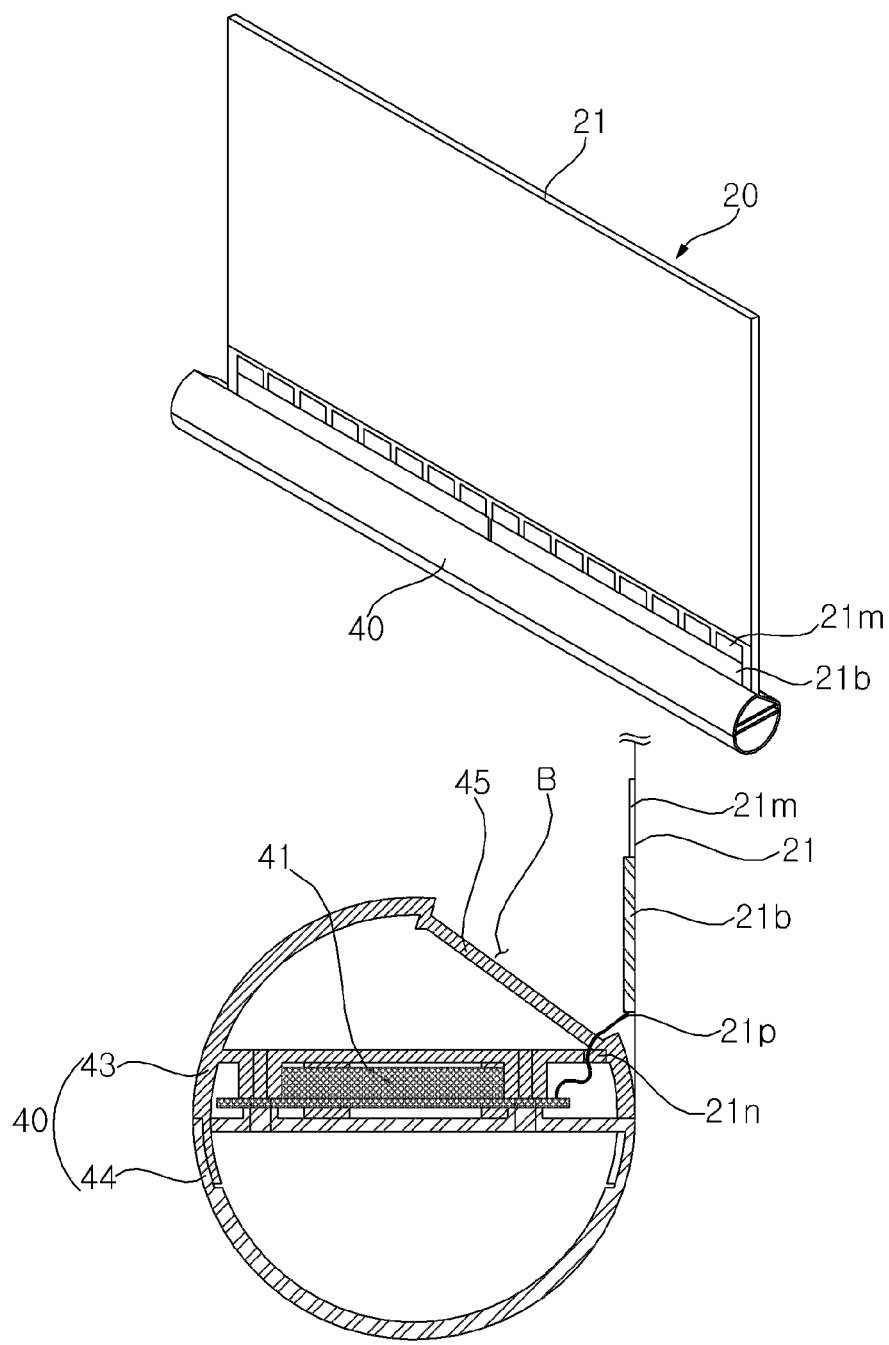

Referring to FIG. 11, the display panel 21 may be connected to the roller 40. The display panel 21 may be wound around or unwound from the roller 40. The display panel 21 may be electrically connected to the plurality of source PCBs 21b. The plurality of source PCBs 21b may be spaced apart from each other.

A source chip on film (COF) 21m may connect the display panel 21 and the source PCB 21b. The source COF 21m may be located in the lower side of the display panel 21. The roller 40 may include a first part 43 and a second part 44. The first part 43 and the second part 44 may be fastened by a screw. The timing controller board 41 may be mounted inside the roller 40.

The source PCB 21b may be electrically connected to the timing controller board 41. The timing controller board 41 may transmit digital video data and a timing control signal to the source PCB 21b.

A cable 21p may electrically connect the source PCB 21b and the timing controller board 41. For example, the cable 21p may be a flexible flat cable (FFC). The cable 21p may pass through the hole 21n. The hole 21n may be formed in a seating portion 45 or the first part 43. The cable 21p may be located between the display panel 21 and the second part 44.

The seating portion 45 may be formed in the outer perimeter of the first part 43. The seating portion 45 may be formed by stepping a portion of the outer perimeter of the first part 43. The seating portion 45 may form a space B.

When the display unit 20 is wound around the panel roller 40, the source PCB 21b may be received in the seating portion 45. Since the source PCB 21b is received in the seating portion 45, it may not be bent or crooked, and durability may be improved.

Figure 12:
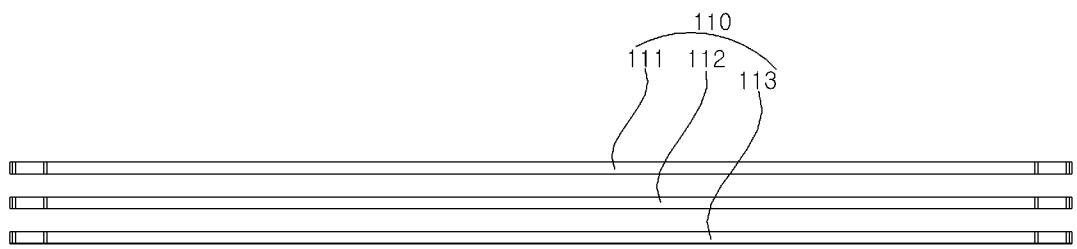
Figure 13:
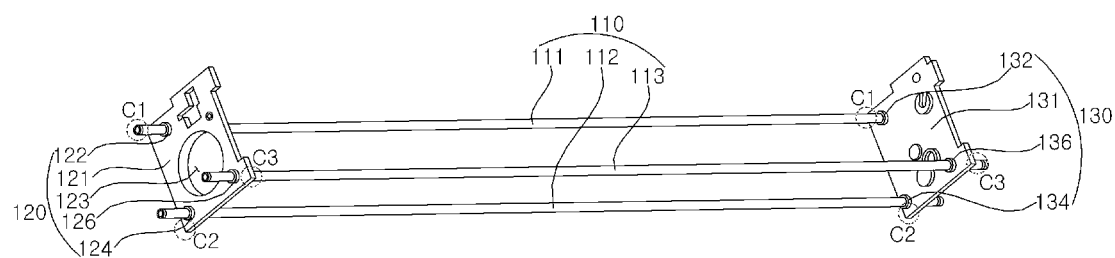

Referring to FIGS. 12 and 13, a pipe 110 may extend long in the left-right direction. There may be a plurality of pipes 110. The plurality of pipes 110 may include a first pipe 111, a second pipe 112, and a third pipe 113. The plurality of pipes 110 may be parallel to each other. For example, the pipe 110 may be a hollow cylinder. As another example, the pipe 110 may be a cylindrical bar.

The pipe 110 may be coupled to a frame 120, 130 while being inserted into the frame 120, 130. The frame 120, 130 may include a first frame 120 and a second frame 130. The first frame 120 may be located adjacent to one end of the pipes 110, and the second frame 130 may be located adjacent to the other end of the pipes 110. The first frame 120 may face the second frame 130.

For example, the frame 120, 130 may be a rectangular plate. The first pipe 111 may be inserted into the frames 120 and 130 while being adjacent to a first corner C1 of the first frame 120 and the second frame 130. The second pipe 112 may be inserted into the frames 120 and 130 while being adjacent to a second corner C2 of the first frame 120 and the second frame 130. The third pipe 113 may be inserted into the frames 120 and 130 while being adjacent to a third corner C3 of the first frame 120 and the second frame 130.

A central opening 123 may be formed in a plate 121 of the first frame 120. The central opening 123 may be a circle formed by penetrating the plate 121 of the first frame 120. The first pipe 111, the second pipe 112, and the third pipe 113 may be disposed while forming a triangle with respect to the central opening 123.

Referring to FIG. 13, couplers 122, 124, 126, 132, 134, and 136 may be formed in the plates 121 and 131. The first frame 120 may include a 11 coupler 122, a 12 coupler 124, and a 13 coupler 126 formed in the plate 121. The second frame 130 may include a 21 coupler 132, a 22 coupler 134, and a 23 coupler 136 formed in the plate 131. The first pipe 111 may be inserted into the 11 coupler 122 and the 21 coupler 132. The second pipe 112 may be inserted into the 12 coupler 124 and the 22 coupler 134. The third pipe 113 may be inserted into the 13 coupler 126 and the 23 coupler 136. The coupler 122,124,126,132,134,136 may be referred to as an intermediate coupler 122,124,126,132,134,136.

Figure 14:
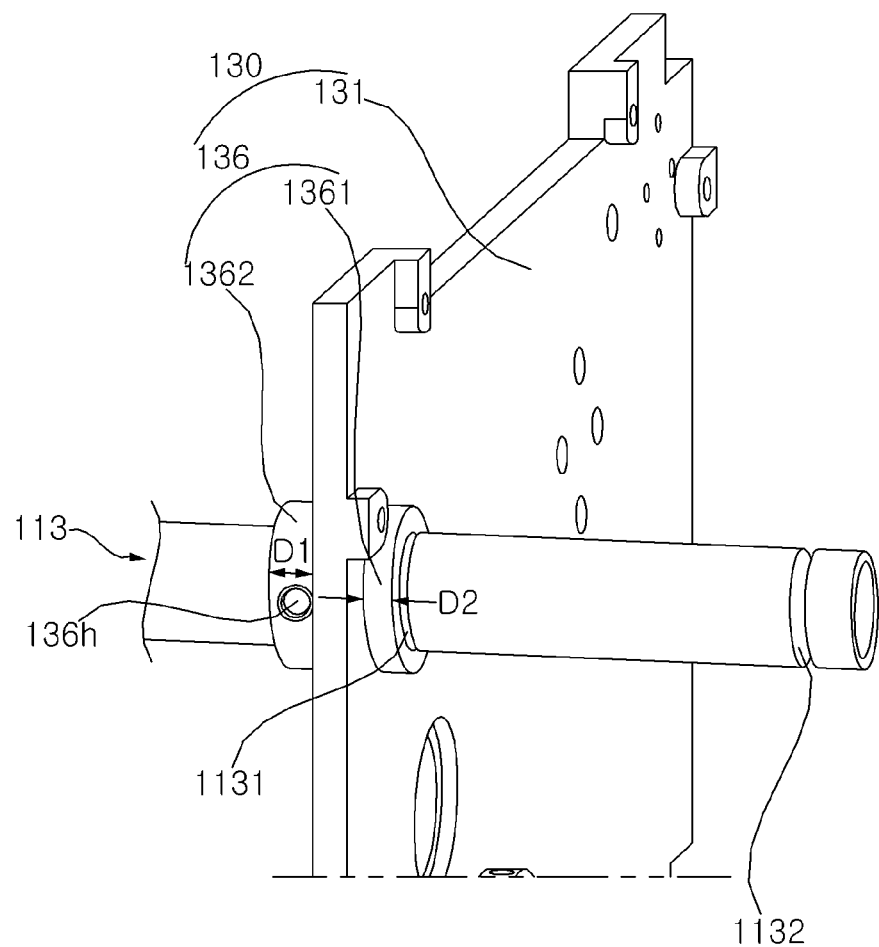
Figure 15:
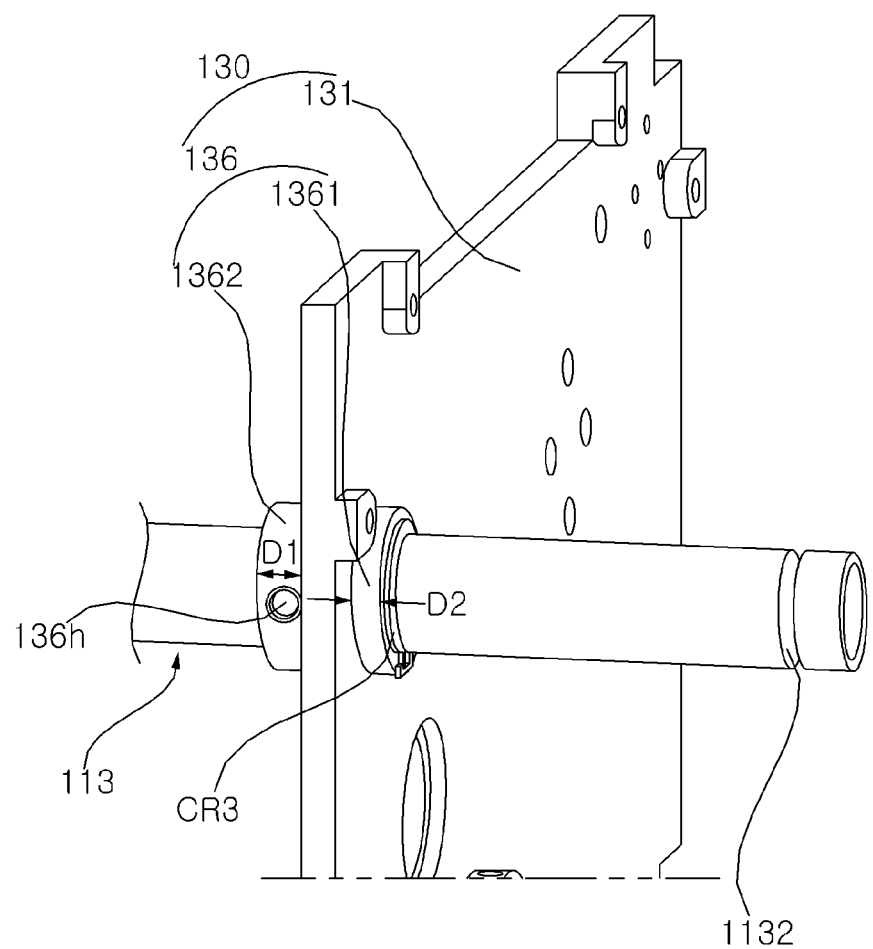
Figure 16:
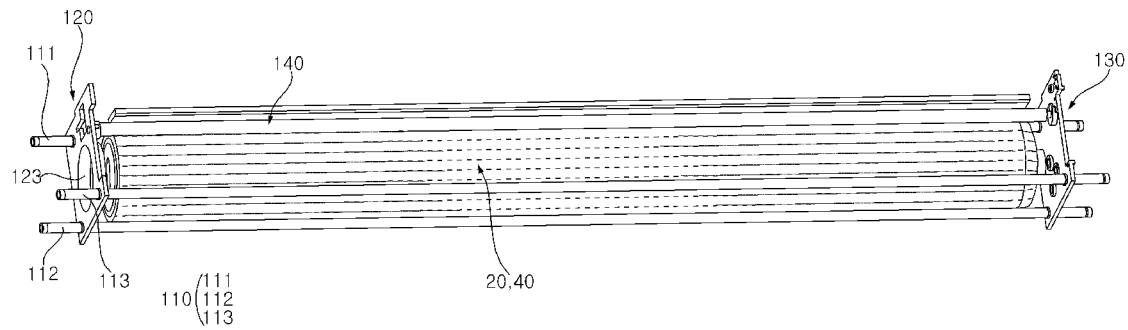
Figure 17:
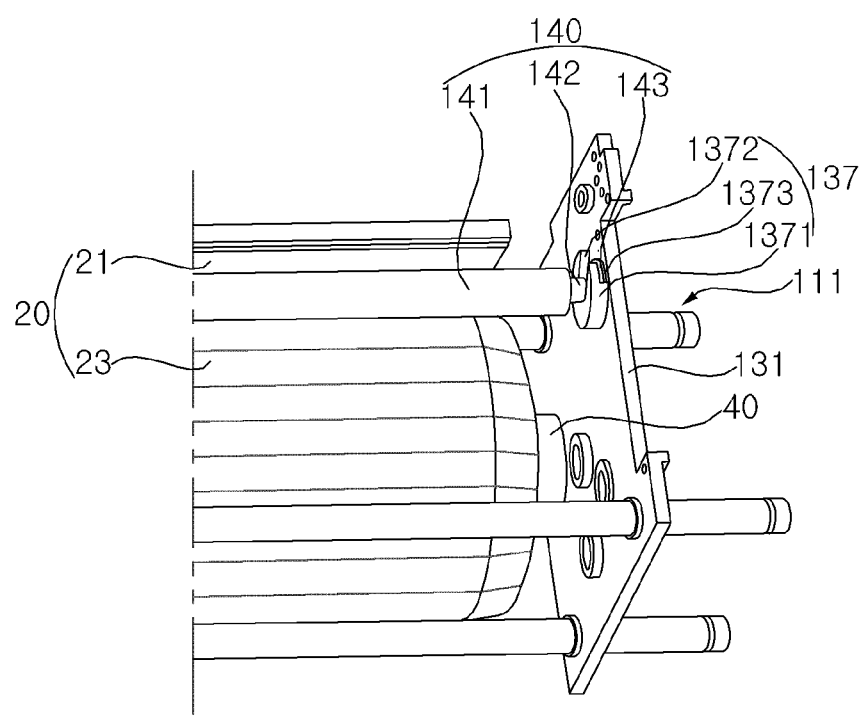
Figure 18:
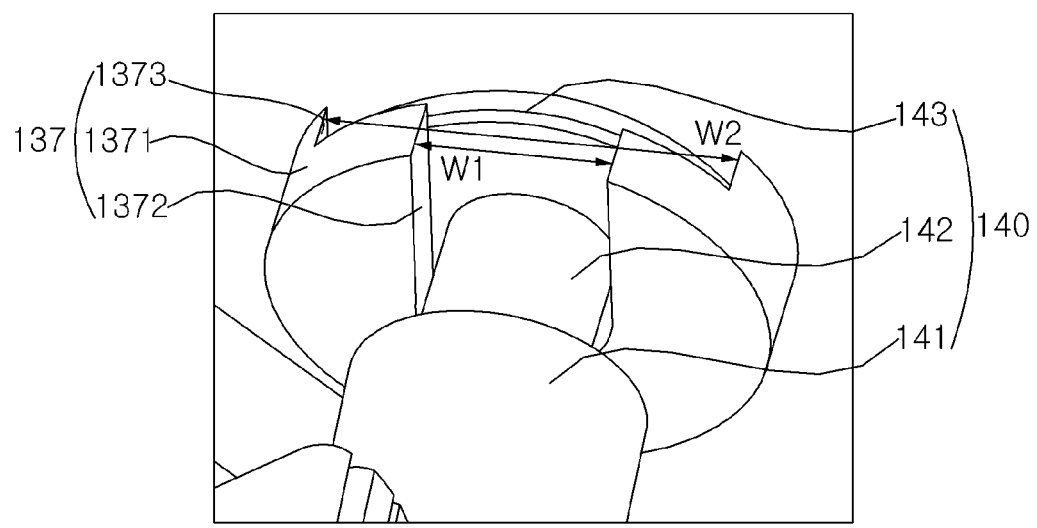
Figure 19:
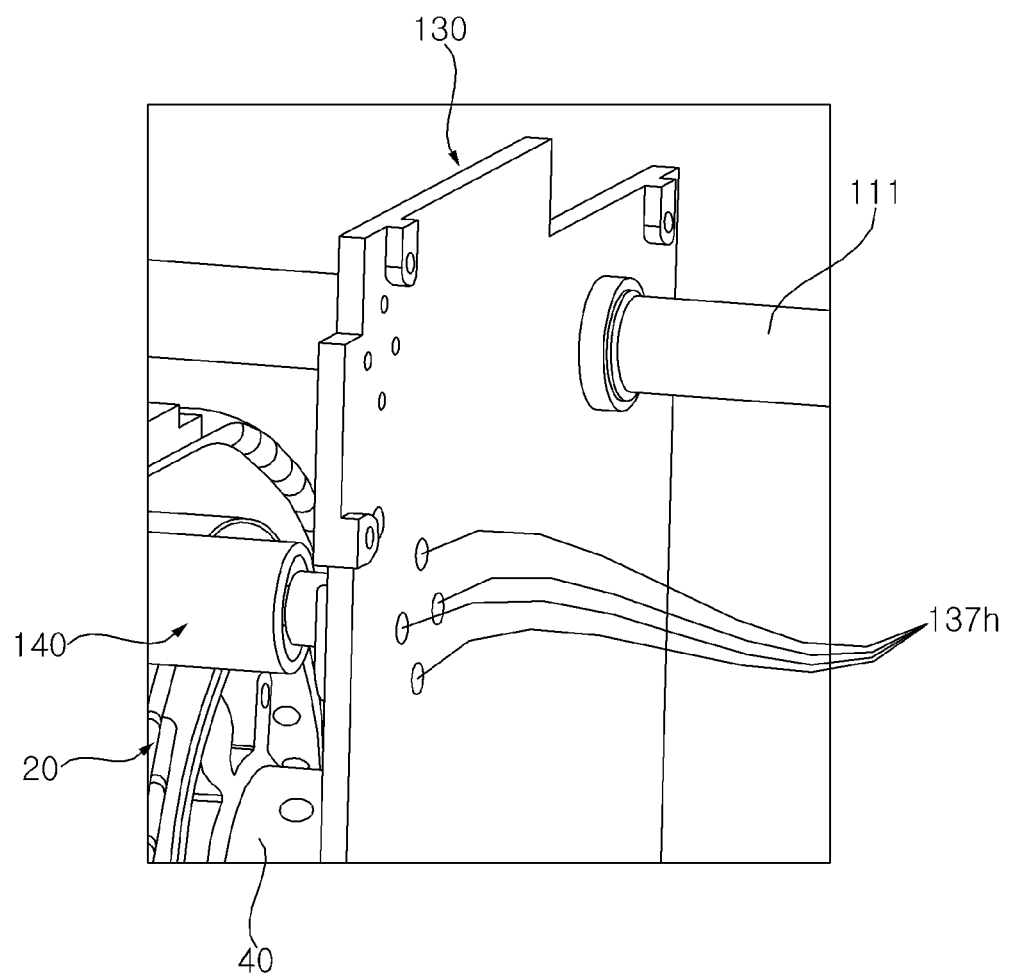

Referring to FIGS. 14 and 15, the coupler 136 may have a cylindrical shape formed by penetrating the plate 131. The coupler 136 may be fixed to the plate 131, and may be formed with the plate 131 as one body. The coupler 136 may have an outer side 1361 and an inner side 1362 with respect to the plate 131. A distance D2 of the outer side 1361 may be smaller than a distance D1 of the inner side 1362. A fastening hole 136h may be formed in the inner side 1362. The pipe 113 may be fixed to the frame 130 while the screw is fastened to the fastening hole 136h.

A first neck 1131 may form an engraved ring on the outer surface of the pipe 113 while being recessed to the inner side of the pipe 113 while being adjacent to the outer side 1361 of the coupler 136. A second neck 1132 may be adjacent to a distal end of the pipe 113, but may be spaced apart from the distal end of the pipe 113 and recessed to the inner side of the pipe 113 to form an engraved ring on the outer surface of the pipe 113. The pipe 113 may be firmly fixed to the frame 130 while a coupling ring CR3 is fastened to the first neck 1131. For example, the coupling ring CR3 may be an E-ring.

Referring to FIGS. 16 to 19, the display unit 20 wound around the panel roller 40 may be inserted between the first pipe 111, the second pipe 112, the third pipe 113, the first frame 120, and/or the second frame 130. The panel roller 40 may be disposed in parallel with the first pipe 111, the second pipe 112, or the third pipe 113.

A guide roller 140 may be coupled to the frames 120 and 130 while the panel roller 40 and the display unit 20 are located between the pipes 110 and the frames 120 and 130. The guide roller 140 may include a shaft 142, a roller 141, and a fixing plate 143.

A support portion 137 may be formed on the plate 131. The support portion 137 may support the shaft 142 of the guide roller 140. The shaft 142 may be fixed to the support portion 137, and the roller 140 can rotate on the shaft 142. The support portion 137 may be formed in the inner side of the plate 131.

The support portion 137 may include a body 1371, a shaft groove 1372, and a plate-in groove 1373. The body 1371 may have a cylindrical shape protruding from the inner surface of the plate 131. The shaft groove 1372 may be recessed to the inner side of the body 1371 from the outer circumferential surface of the body 1371. The plate-in groove 1373 may be recessed to the inside of the body 1371 from the outer circumferential surface of the body 1371 between the shaft groove 1372 and the plate 131. A groove width W2 of the plate-in groove 1373 may be larger than a groove width W1 of the shaft groove 1372.

In other words, the shaft groove 1372 may have a groove width W1 corresponding to the diameter of the shaft 142, and the plate-in groove 1373 may have a groove width W2 corresponding to the diameter of the fixing plate 143. The shaft 142 of the guide roller 140 may be inserted into the shaft groove 1372 of the support portion 137, and the fixing plate 143 of the guide roller may be inserted into the plate-in groove 1373 of the support portion 137 while the guide roller 140 is supported by the support portion 137.

Figure 21:
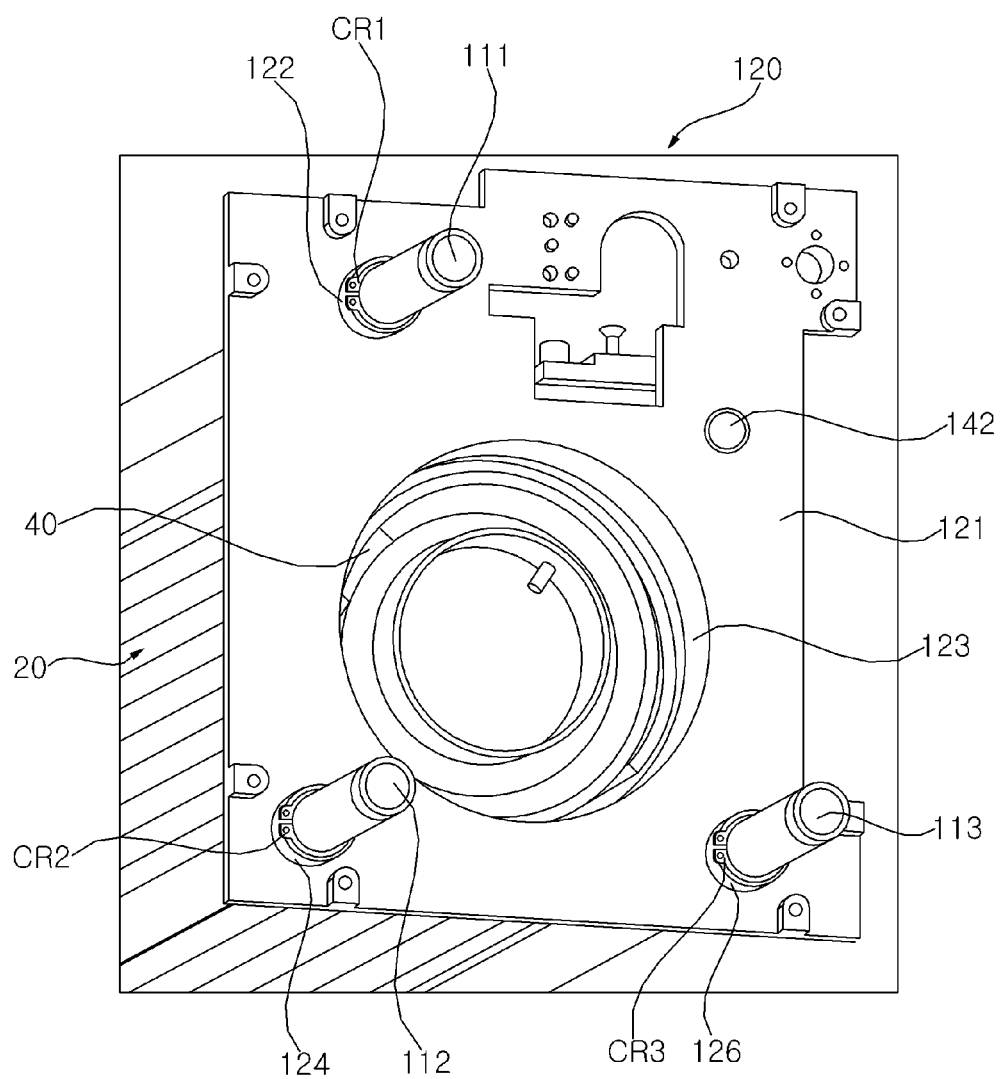
Figure 22:
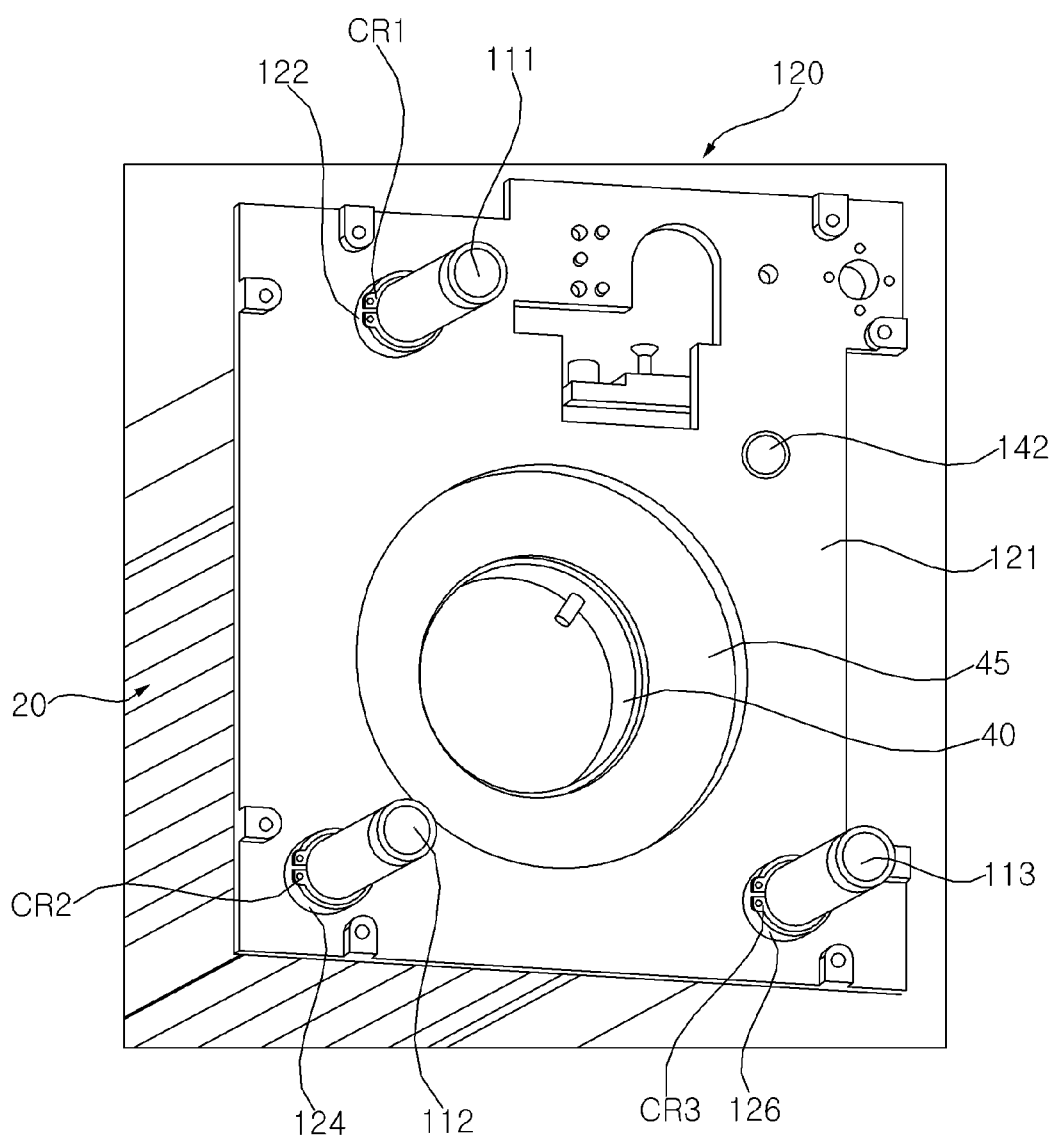

The fixing plate 143 may be fixed to the frame 130 by a fastening member (e.g. a screw) fastened to the fastening holes 137h penetrating the frame 130. Referring to FIG. 21, the shaft 142 may be inserted into and fixed to the frame 120.

Figure 20:
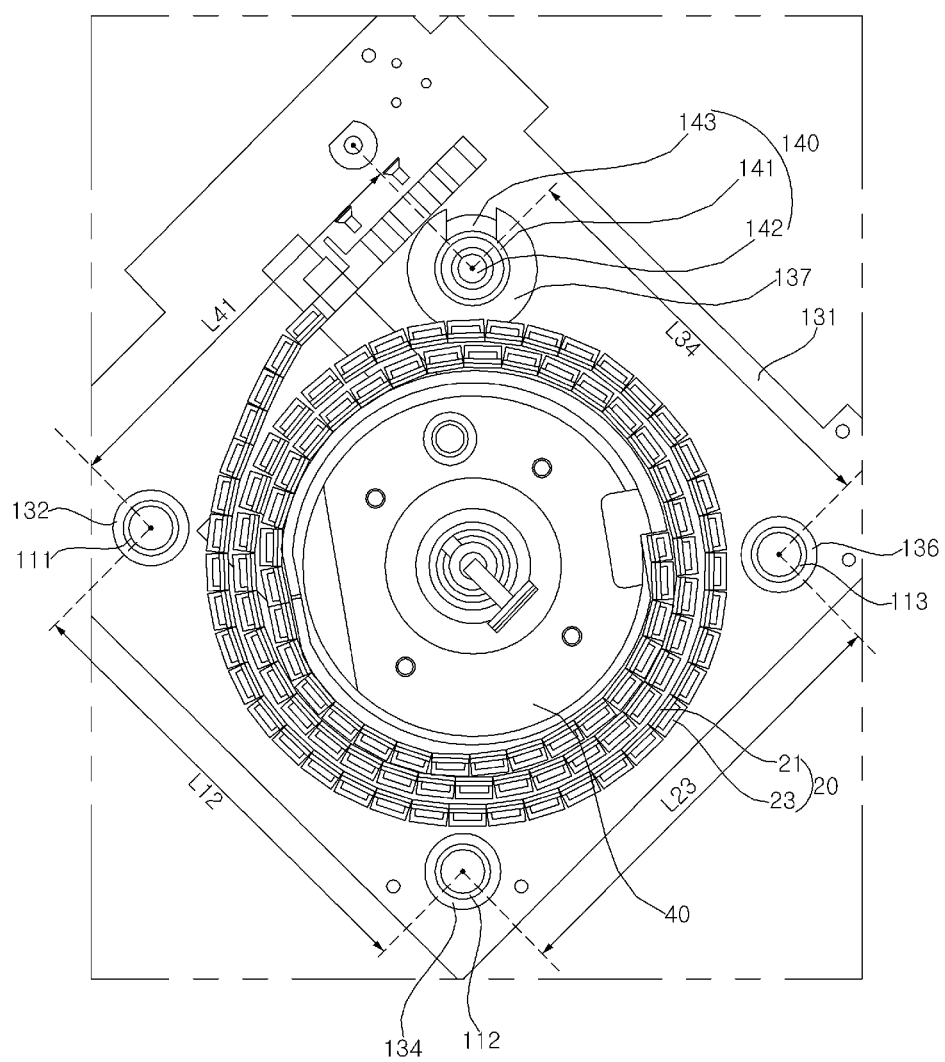

Referring to FIG. 20, a distance L12 between the first pipe 111 and the second pipe 112 may be larger than a distance L23 between the second pipe 112 and the third pipe 113. A distance L12 between the first pipe 111 and the second pipe 112 may be larger than a distance L34 between the third pipe 113 and the guide roller 140. A distance L12 between the first pipe 111 and the second pipe 112 may be larger than a distance L41 between the first pipe 111 and the guide roller 140.

A distance L23 between the second pipe 112 and the third pipe 113 may be larger than a distance L41 between the first pipe 111 and the guide roller 140. A distance L23 between the second pipe 112 and the third pipe 113 may be larger than a distance L34 between the third pipe 113 and the guide roller 140. A distance L34 between the third pipe 113 and the guide roller 140 may be larger than a distance L41 between the guide roller 140 and the first pipe 111.

Accordingly, the torsional rigidity of the display device as well as the sagging rigidity can be improved.

Referring to FIGS. 21 to 24, one end of the panel roller 40 may be located adjacent to the central opening 123 of the first frame 120. The rotation shaft of the panel roller 40 may be aligned with the center of the central opening 123 of the first frame 120. A bearing 450 may be mounted in the central opening 123 of the first frame 120. For example, the bearing 450 may be a ring bearing 450.

One end of the panel roller 40 may be inserted or press-fitted into the bearing 450. The other end of the panel roller 40 may be rotatably coupled to the second frame 130. The panel roller 40 may include a rotation shaft 46, and the rotation shaft 46 may penetrate the first frame 130 and be installed in the second frame 130. The rotation shaft 46 may be connected to a lever 47, and the panel roller 40 may be manually rotated through the lever 47.

The coupler 136 may have a cylindrical shape formed by penetrating the plate 131. The coupler 136 may be fixed to the plate 131, and may be formed with the plate 131 as one body. The coupler 136 may have an outer side 1361 and an inner side 1362 with respect to the plate 131. The distance D2 of the outer side 1361 may be smaller than the distance D1 of the inner side 1362. For example, the distance D1 of the inner side 1362 may be 5 times or more of the distance D2 of the outer side 1361.

The pipes 112 and 113 may be press-fitted to the outer sides 1341 and 1361 by penetrating inner sides 1342 and 1362 of the couplers 134 and 136. The pipes 112 and 113 may not penetrate the couplers 134 and 136. The outer sides 3141 and 1361 of the couplers 134 and 136 may cover the distal end of the pipes 112 and 113. A first fastening hole 136h1 and a second fastening hole 136h2 may be formed in the inner side 1362. As the screws are fastened to the first fastening hole 136h1 and the second fastening hole 136h2, the pipe 113 may be firmly fixed to the frame 130.

Figure 25:
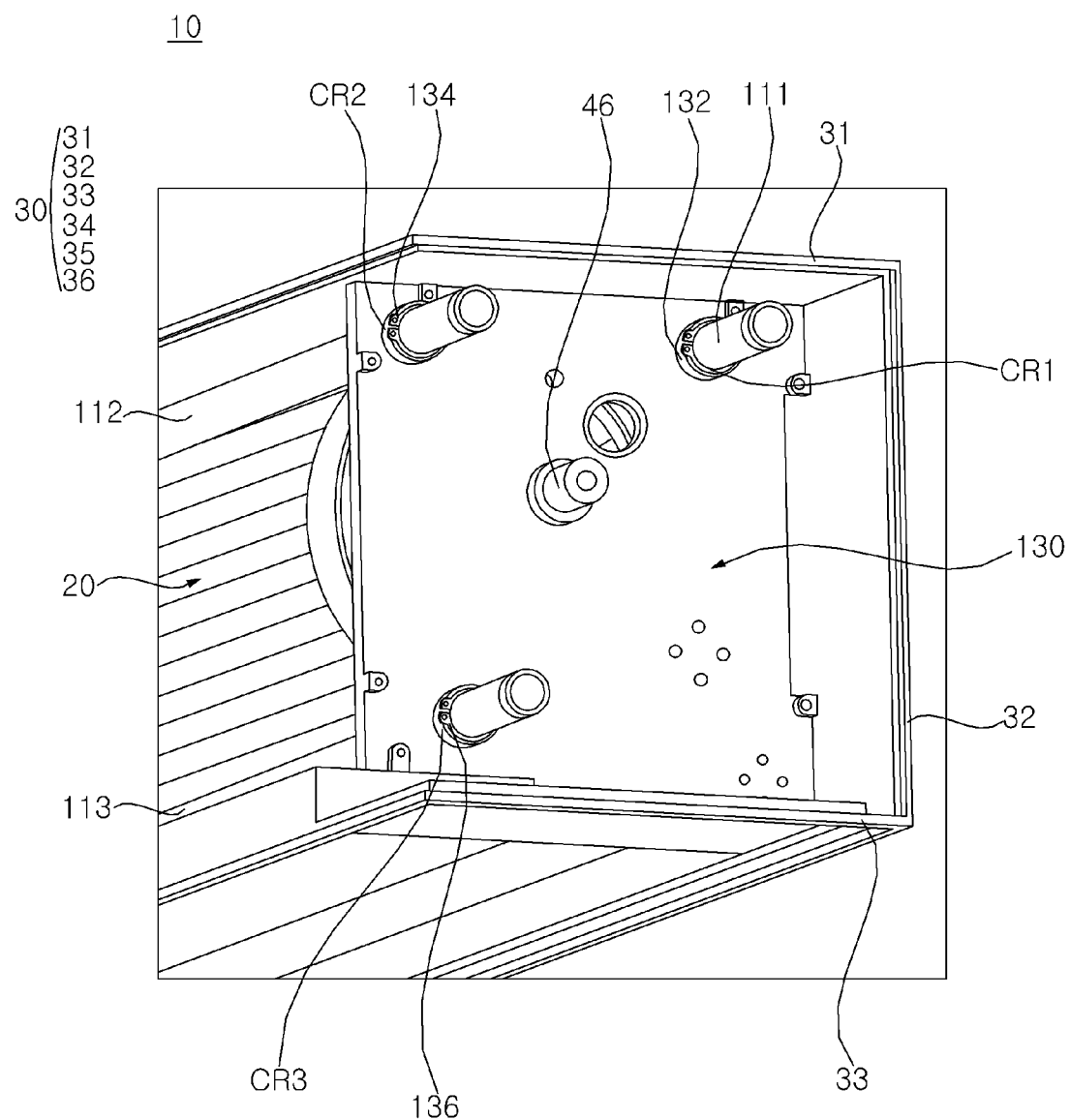

Referring to FIG. 25, the housing 30 may include an upper plate 31, a lower plate 33, a front plate 34 (refer to FIG. 1), and a rear plate 32. The upper plate 31 may be coupled to the first frame 120 and the second frame 130 while covering the first pipe 111 and the second pipe 112. The front plate 34 may be coupled to the first frame 120 and the second frame 130 while covering the second pipe 112 and the third pipe 113. The rear plate 32 may be coupled to the first frame 120 and the second frame 130 while covering the first pipe 111 and the guide roller 140. The lower plate 33 may be coupled to the first frame 120 and the second frame 130 while covering the third frame 113 and the guide roller 140. The lower plate 33 may be a door.

Figure 26:
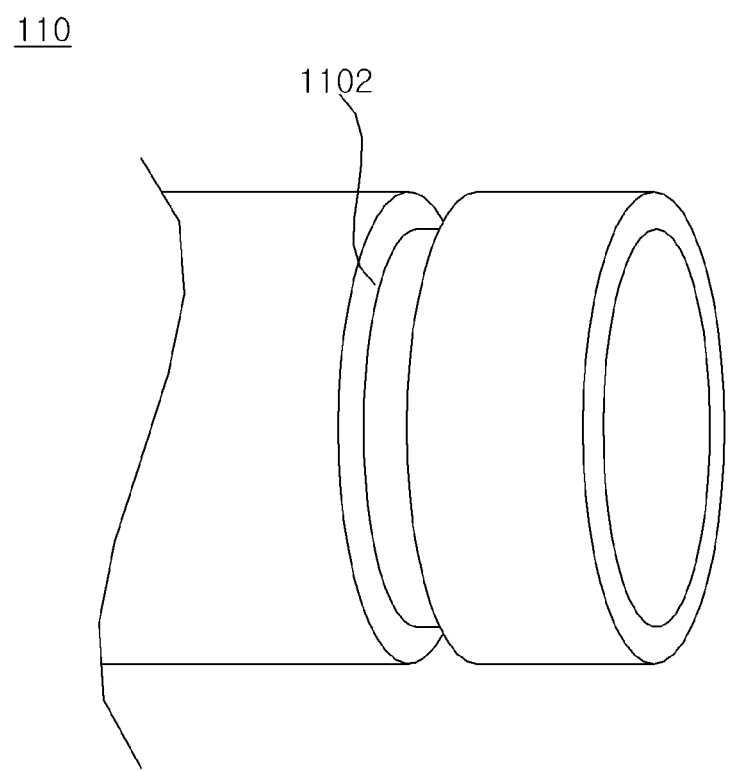
Figure 27:
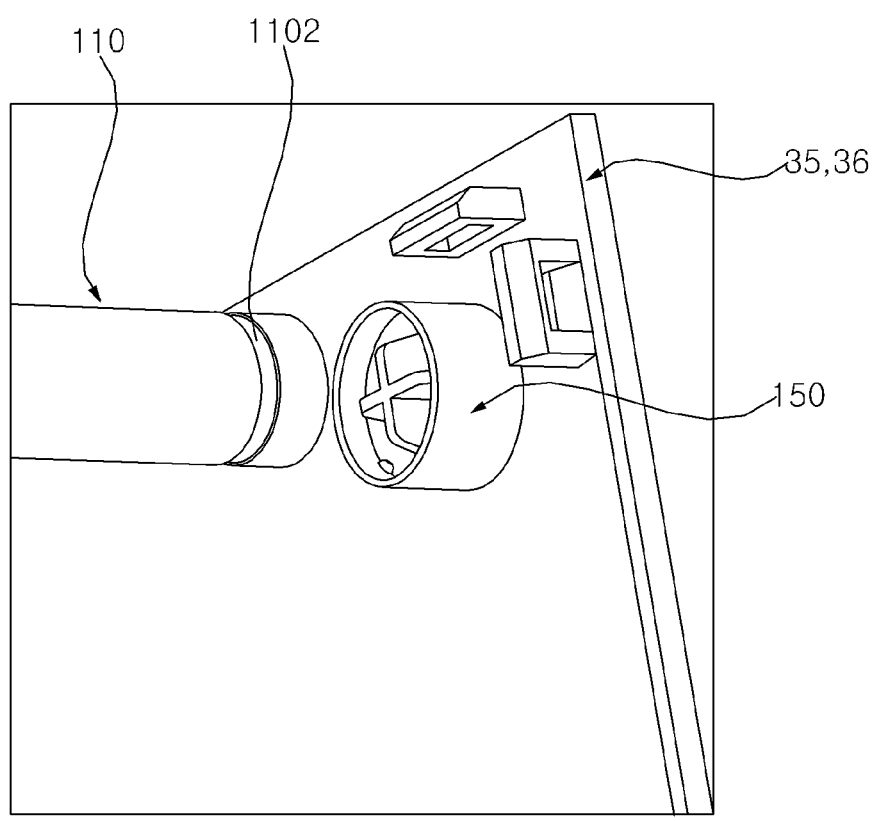

Referring to FIGS. 26 and 27, the pipe 110 may include a neck 1102 which is located adjacent to a distal end and formed on the outer circumferential surface of the pipe 110. The neck 1102 may be a second neck 1132 described with reference to FIGS. 14 and 15. The description of the pipe 110 may be applied to the first pipe 111, the second pipe 112, and the third pipe 113 described above.

The pipe 110 may be coupled to a side cover 35, 36. The coupler 150 may be formed in an inner side the side cover 35, 36. The pipe 110 may be inserted or press-fitted into the coupler 150 to be fixed to the side cover 35, 36. The coupler 150 may be referred to as an end-coupler 150.

Figure 28:
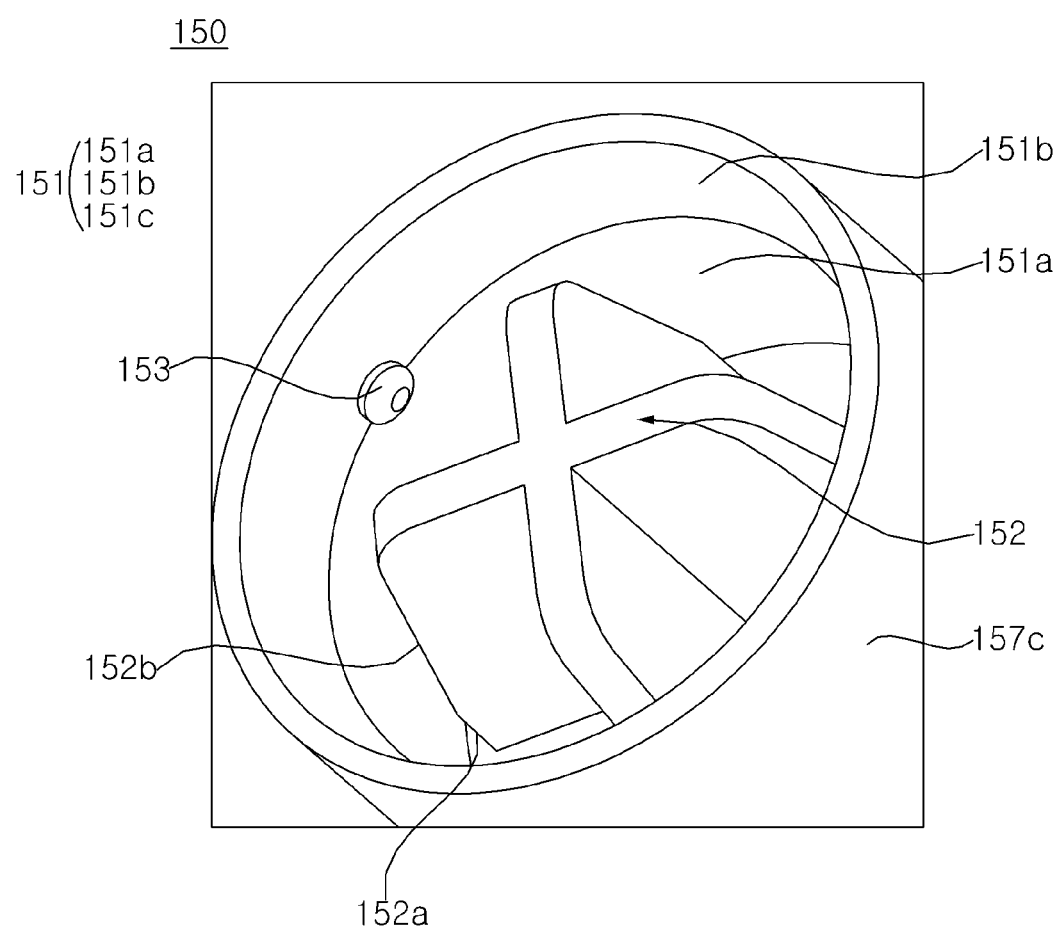
Figure 29:
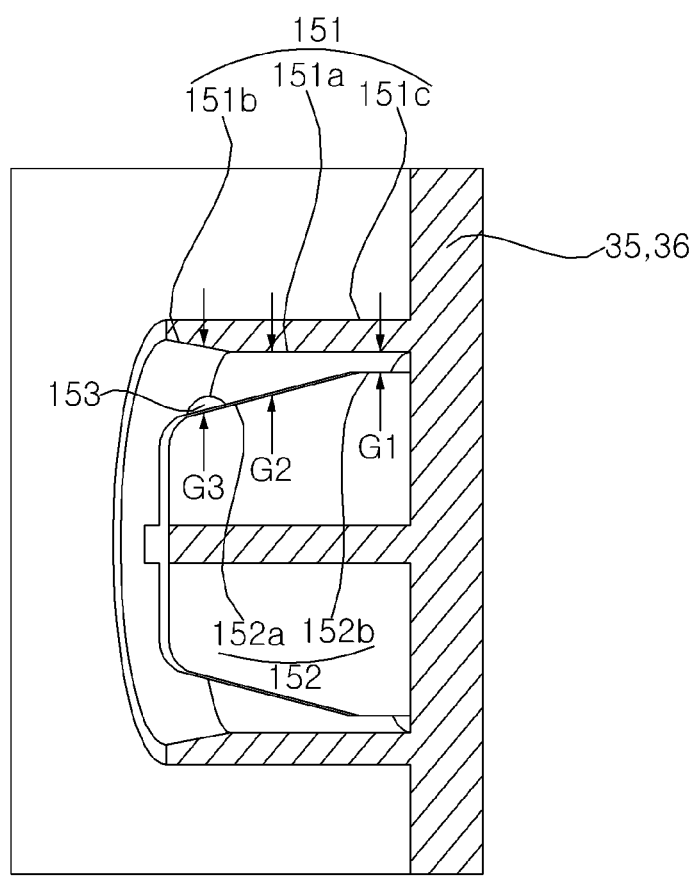

Referring to FIGS. 28 and 29, the coupler 150 may include an outer cylinder 151 and an inner insert 152. The outer cylinder 151 may have a hollow cylindrical shape. The outer cylinder 151 may include an outer surface 151c, a first inner surface 151a, and a second inner surface 151b. The first inner surface 151a may be parallel to the outer surface 151c. The second inner surface 151b may extend from the first inner surface 151a to a distal end of the outer cylinder 151 while having an inclination. The diameter of the second inner surface 151b may gradually increase from the diameter of the first inner surface 151a to the diameter of the outer surface 151c. The second inner surface 151b may be referred to as a guide surface 151b, and the first inner surface 151a may be referred to as a press-fitting surface 151a. A protrusion 153 may be formed in an inner side the outer cylinder 151. For example, the protrusion 153 may be located in a boundary between the first inner surface 151a and the second inner surface 151b.

The inner insert 152 may be a rib extending from the side cover 35, 36 (refer to FIG. 27) toward a distal end of the second inner surface 151b of the outer cylinder 151. The inner insert 152 may have a shape in which at least two ribs are crossed. The inner insert 152 may have a first outer surface 152a and a second outer surface 152b. The first outer surface 152a may be spaced apart from the first inner surface 151a of the outer cylinder 151, and may be parallel to the first inner surface 151a of the outer cylinder 151. For example, a gap G1 between the first inner surface 151a of the outer cylinder 151 and the first outer surface 152a of the inner insert 152 may be substantially equal to the thickness of the pipe 110 or may be less than the thickness of the pipe 110. The second outer surface 152b of the inner insert 152 may extend from the first outer surface 152a while being inclined toward the distal end of the inner insert 152. The second outer surface 152b of the inner insert 152 may gradually move away from the first inner surface 151a and/or the second inner surface 151b of the outer cylinder 151. For example, the inner insert 152 may have a wedge shape. The second outer surface 152b of the inner insert 152 may face the first inner surface 151a and the second inner surface 151b of the outer cylinder 151.

A distance G1 between the first inner surface 151a of the outer cylinder 151 and the first outer surface 152a of the inner insert 152 may be smaller than a distance G2 between the first inner surface 151a of the outer cylinder 151 and the second outer surface 152b of the inner insert 152. A distance G2 between the first inner surface 151a of the outer cylinder 151 and the second outer surface 152b of the inner insert 152 may be smaller than a distance G3 between the second inner surface 151b of the outer cylinder 151 and the second outer surface 152b of the inner insert 152.

Figure 30:
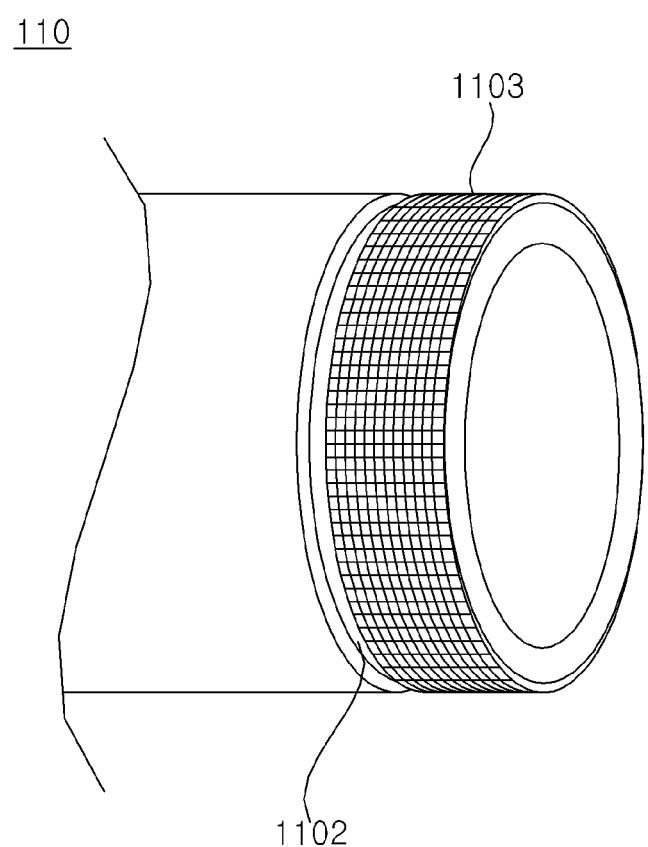

Referring to FIG. 30, the pipe 110 may have a press-fitting surface 1103. The press-fitting surface 1103 may be formed on an outer surface adjacent the distal end of the pipe 110 from the neck 1102 of the pipe 110. The press-fitting surface 1103 may be a rough surface. For example, the press-fitting surface 1103 may be a knurling portion.

Figure 31:
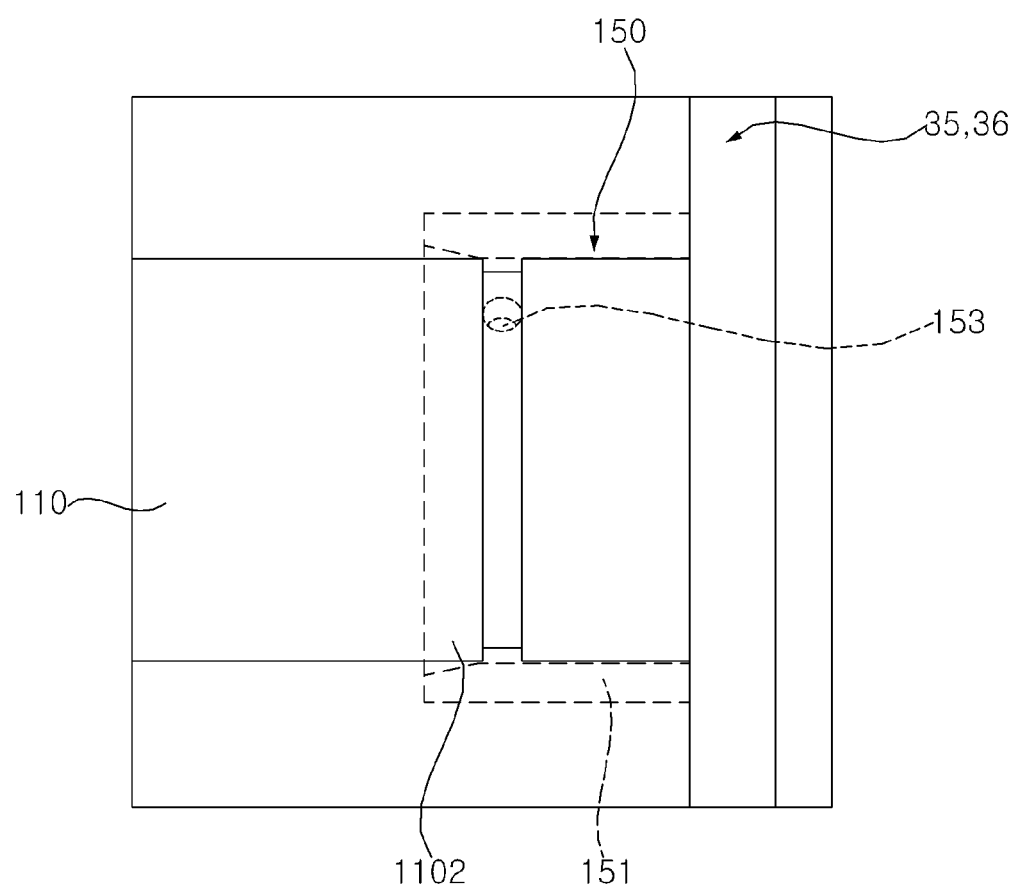
Figure 32:
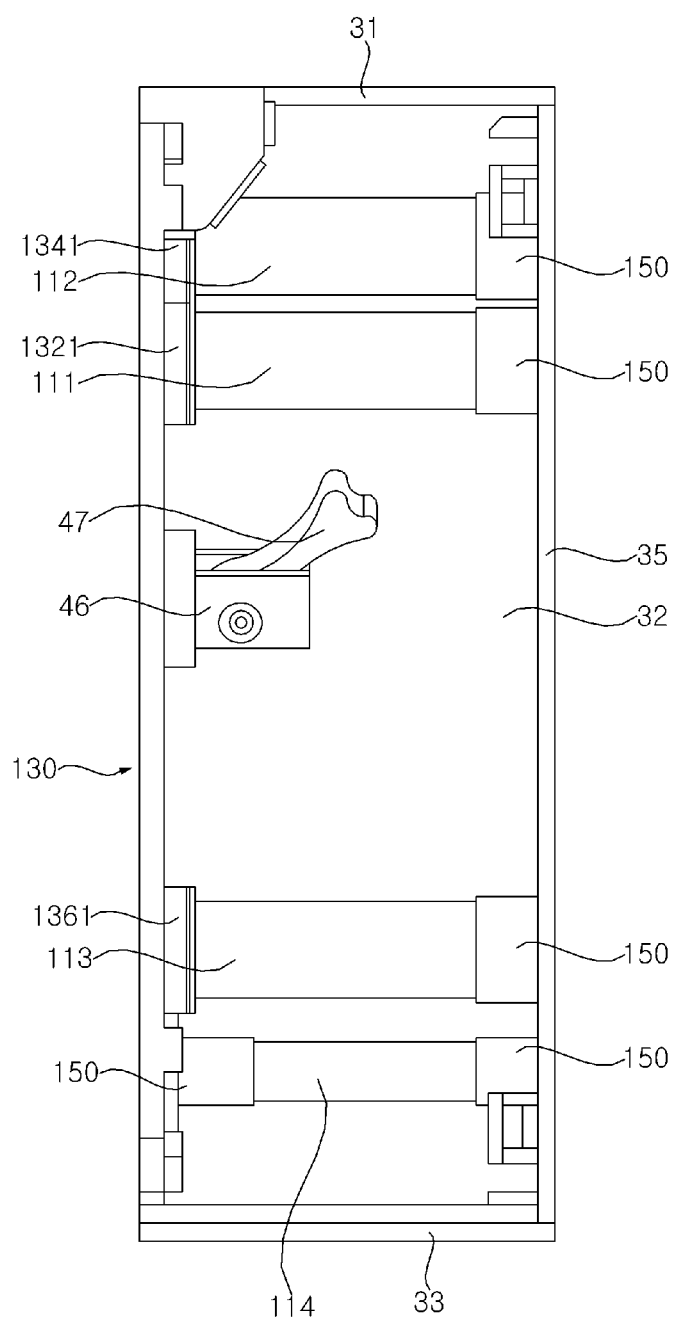
Figure 33:
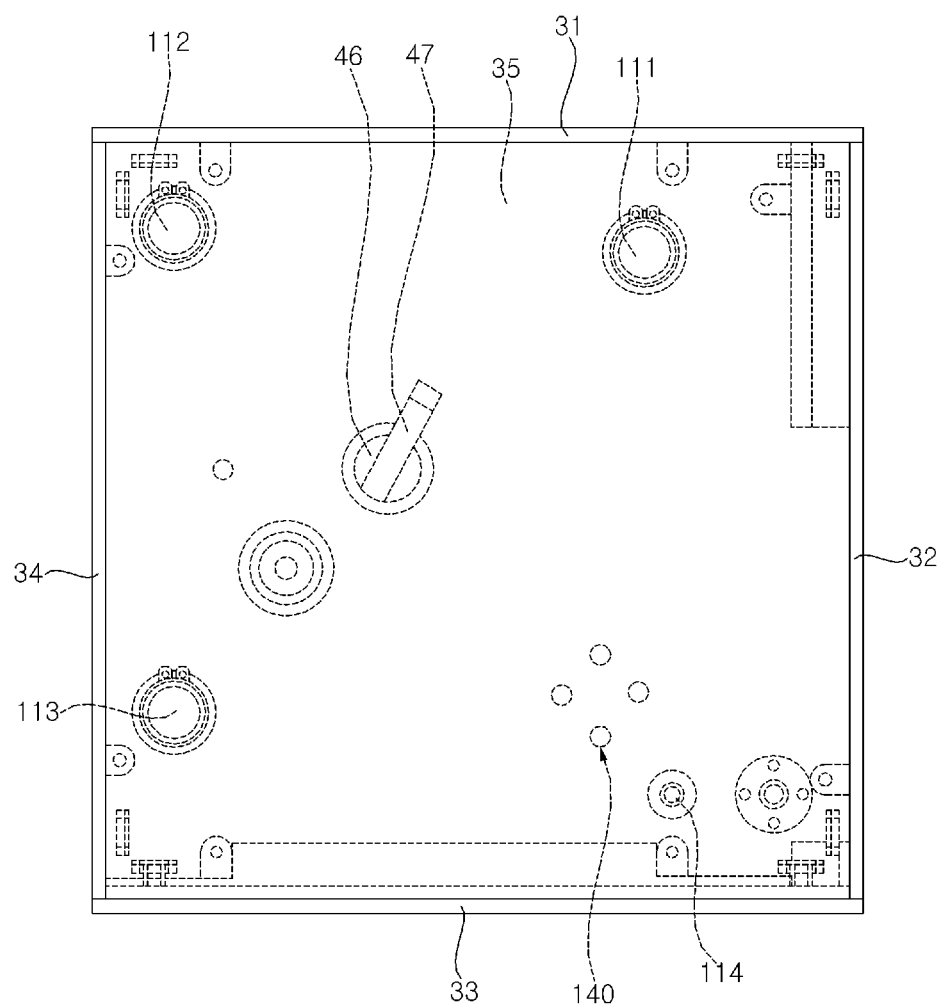

Referring to FIGS. 31 to 33, the pipe 110 may be inserted or press-fitted into the coupler 150. The protrusion 153 may be inserted into the second neck 1102 of the pipe 110. The first pipe 111, the second pipe 112, and the third pipe 113 may be inserted or press-fitted into respective corresponding coupling holes 150. Accordingly, torsional rigidity of the display device can be secured.

Figure 23:
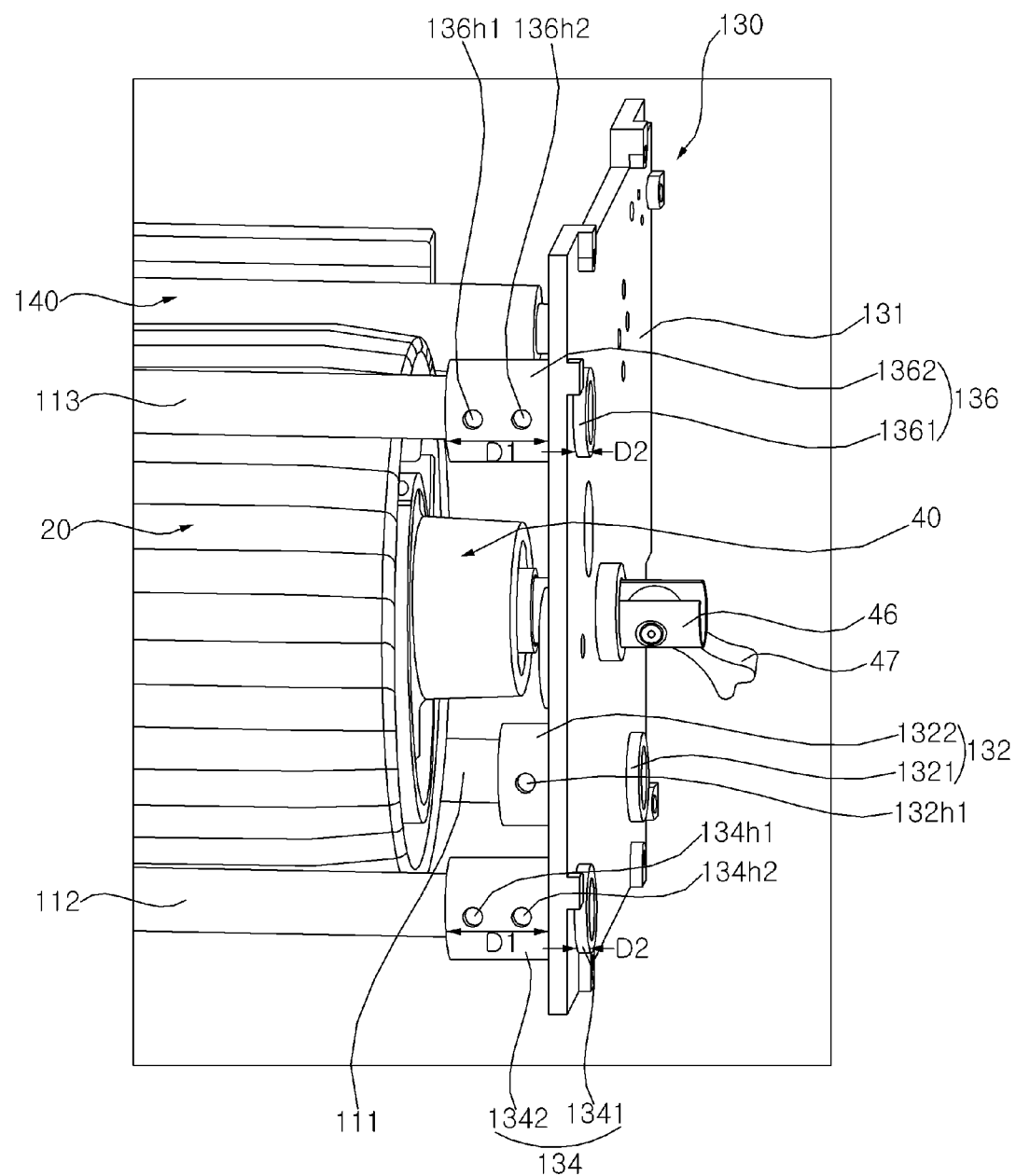
Figure 24:
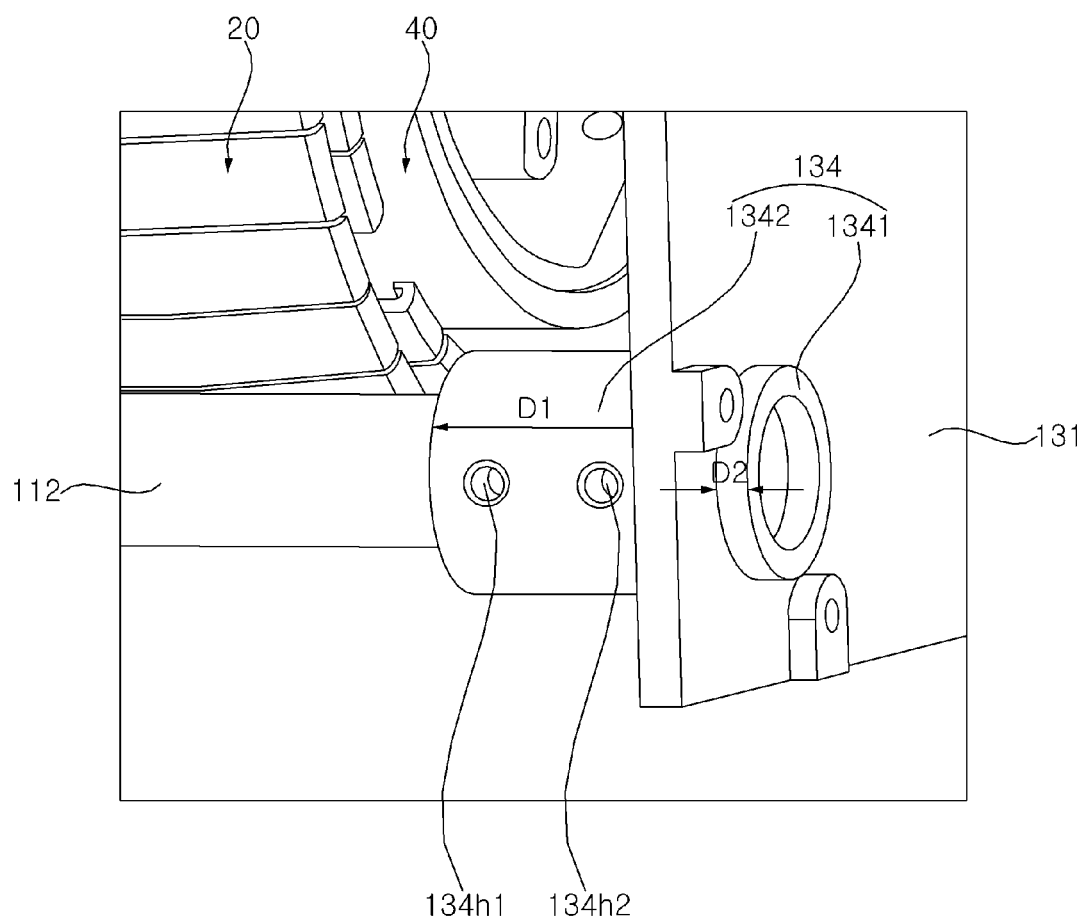

An auxiliary pipe 114 may face the second pipe 112 with respect to the shaft 46 of the roller 40 (refer to FIG. 23). The auxiliary pipe 114 may be inserted or press-fitted into the coupling holes 150 formed in the second frame 130 and the side cover 35. Accordingly, the torsional rigidity of the display device may be further strengthened, and the coupling stability of the side cover may be secured.

Figure 34:
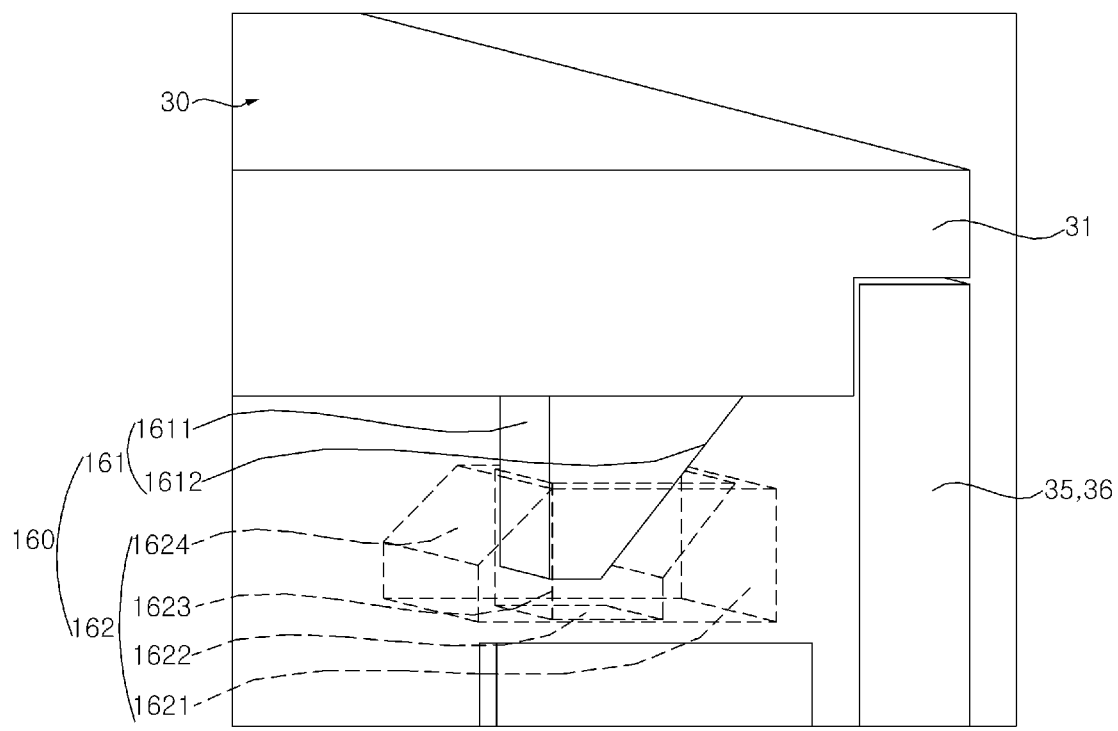

Referring to FIG. 34, the side coupler 160 may couple the housing 30 and the side cover 35, 36. The side coupler 160 may include a locking portion 161 and a holder 162. The locking portion 161 may protrude from the inner side of the upper plate 31 of the housing 30. The locking portion 161 may include a locking surface 1611 and an inclination surface 1612. The locking surface 1611 may extend downward from the inner surface of the upper plate 31. The inclination surface 1612 may connect the lower end of the locking surface 1611 and the inner surface of the upper plate 31. The inclination surface 1612 may face the side cover 35, 36.

The holder 162 may be formed in an inner side of the side cover 35, 36. The holder 162 may include a fixing portion 1621, a locking groove 1622, and a stopper 1623, 1624. The fixing portion 1621 may be fixed to the inner side of the side cover 35, 36. The stopper 1623, 1624 may be located to be spaced apart from the fixing portion 1621. The locking groove 1622 may connect the fixing portion 1621 and the stopper 1623, 1624. The locking groove 1622 may provide a space into which the locking portion 161 is inserted. The stopper 1623, 1624 may include a vertical surface 1623 which faces or is in contact with the locking surface 1611 of the locking portion 161 and a guide surface 1624 on which the inclination surface 1612 of the locking portion 161 slides. The lower surface of the locking groove 1622 may be spaced apart from the locking portion 161.

The side coupler 160 may be provided on the lower plate 33, the front plate 34, and the rear plate 32 as well as on the upper plate 31 of the housing 30. Accordingly, the upper plate 31, the lower plate 33, the front plate 34, and/or the rear plate 32 and the side cover 35, 36 may be firmly coupled.

Figure 35:
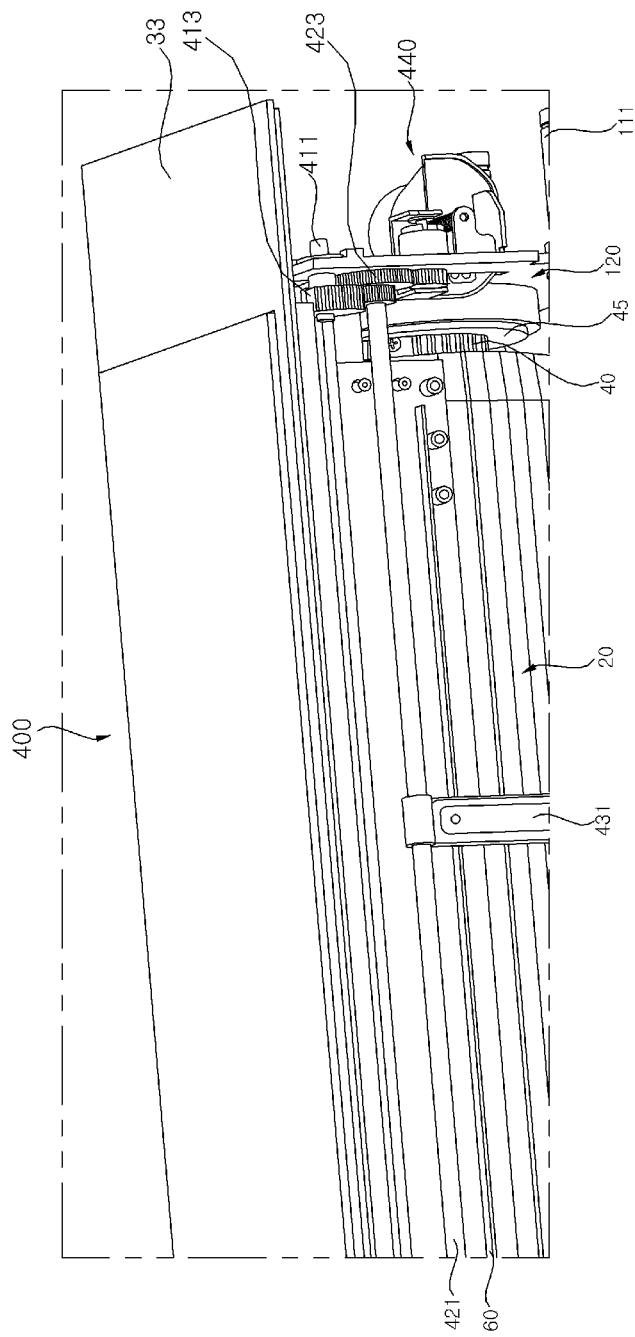
Figure 36:
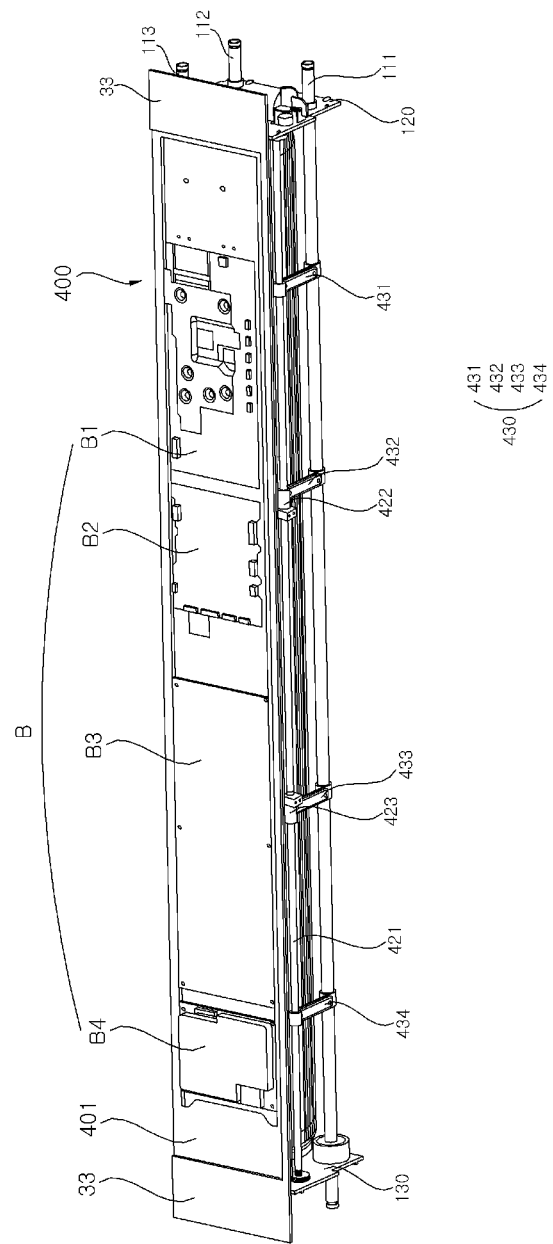

Referring to FIGS. 35 and 36, the door 400 may be coupled to the lower plate 33 of the housing 30. The door 400 may open or close the opening of the lower plate 33 of the housing 30. The lower plate 33 of the housing 30 may have an elongated rectangular shape. The door 400 may be referred to as a door assembly 400.

The door 400 may be smaller than the size of the lower plate 33 of the housing 30. The length of the door 400 may be smaller than the length of the lower plate 33 of the housing 30, and the width of the door 400 may be smaller than the width of the lower plate 33 of the housing 30.

Figure 37:
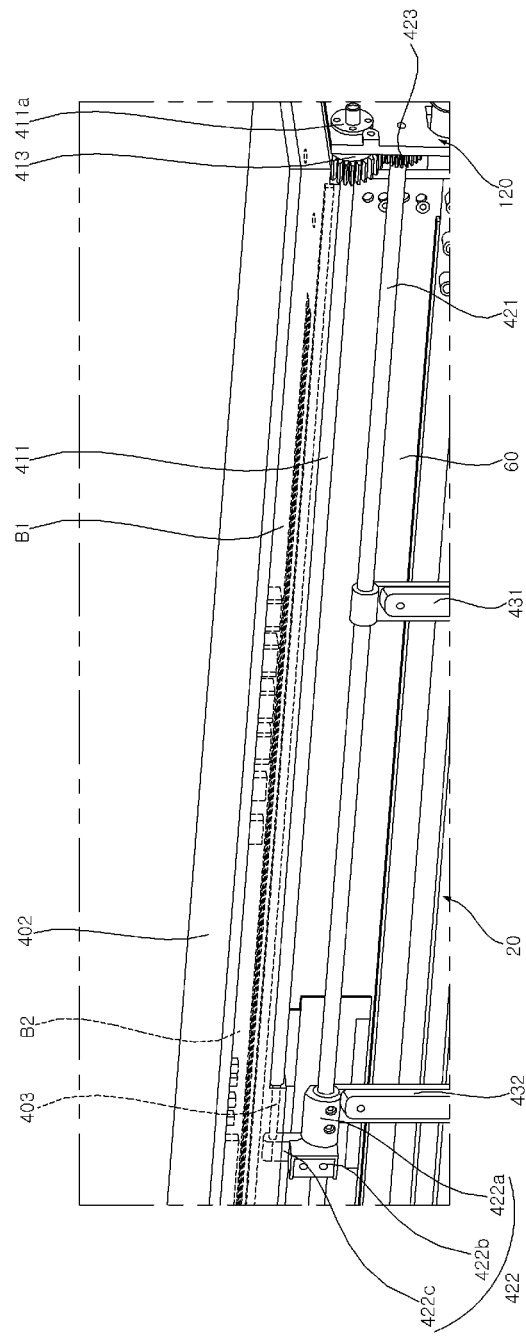

The door 400 may include a storage case 401 and a cover 402 (refer to FIG. 37). A control board B may be received in the storage case 401. For example, the control board B may be a main board B1, a power supply unit B3, a driving control board B2, B4, and the like. The control boards B may be sequentially disposed adjacent to the storage case 401. The cover 402 may be coupled to the storage case 401. The cover 402 may cover the control board B received in the storage case 401.

A bracket 430 may be coupled or fixed to the pipe 111. A plurality of brackets 430 may be provided. A first bracket 431 may be fixed to the first pipe 111 while being adjacent to the first frame 120. A fourth bracket 434 may be fixed to the first pipe 111 while being adjacent to the second frame 130. A second bracket 432 may be located between the first bracket 431 and the fourth bracket 434, and be fixed to the first pipe 111. A third bracket 433 may be located between the second bracket 432 and the fourth bracket 434, and be fixed to the first pipe 111.

Figure 38:
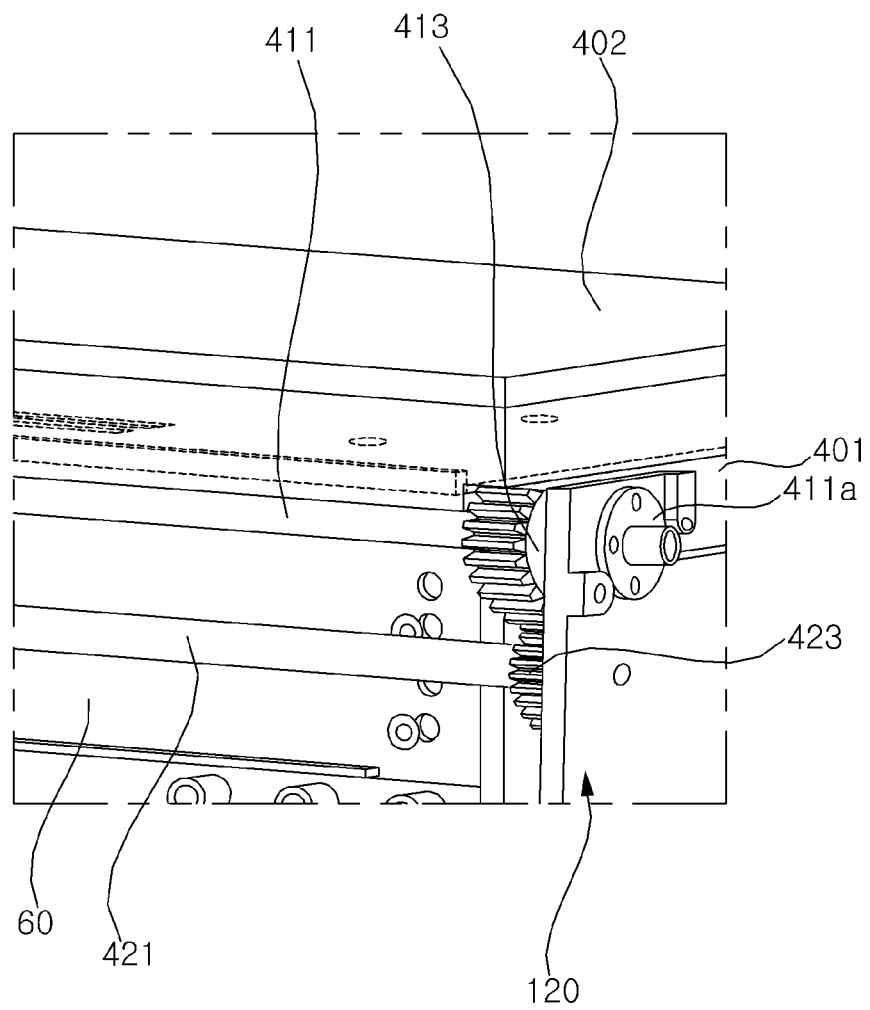
Figure 39:
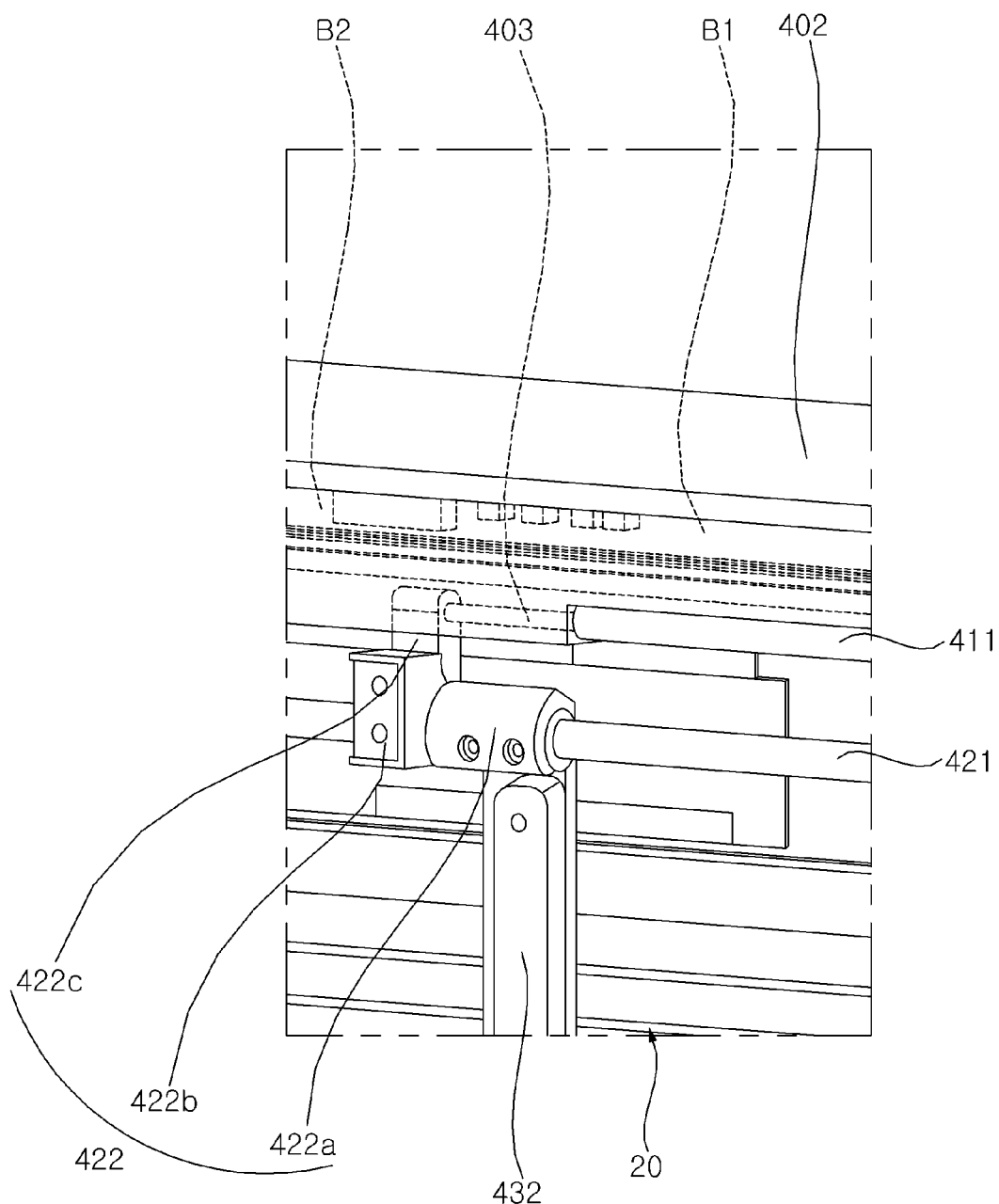

Referring to FIGS. 37 to 39, a first door shaft 411 may be coupled to the door 400. The first door shaft 411 may be located adjacent to the lower edge of the long side of the door 400. One end of the first door shaft 411 may be coupled to the door 400, and the other end may be coupled to the first frame 120. The other end of the first door shaft 411 may be inserted into the first frame 120, and rotate with respect to the first frame 120. A fixing plate 411a may be press-fitted to the first door shaft 411. The fixing plate 411a may be fixed to the first door shaft 411, and may face or contact the outer surface of the first frame 120.

The door 400 may include a first shaft coupling portion 403. The first shaft coupling portion 403 may be formed in a long side of the storage case 401 of the door 400. The first door shaft 411 may be inserted into and fixed to the first shaft coupling portion 403. The first door shaft 411 may be a hollow pipe. The first door shaft 411 may be inserted into a first door gear 413. The first door gear 413 may face or contact the inner surface of the first frame 120. The first door gear 413 may be fixed to the first door shaft 411 and rotate together with the first door shaft 411.

A first shaft holder 422 may be coupled to the second bracket 432 and the first door shaft 411. The first shaft holder 422 may include a body 422b, a door shaft holder 422c, and a rotation shaft holder 422a. The other side of the first door shaft 411 may be fixed to a first shaft coupling portion 403, may be inserted into the door shaft holder 422c, and may rotate in the door shaft holder 422c. The door shaft holder 422c may be formed to protrude from one side of the body 422b. The rotation shaft holder 422a of the first shaft holder 422 may be connected to the upper side of the second bracket 432.

One side of the elongated second bracket 432 may be rolled. A rotation shaft 421 may be inserted into the rolled one side of the second bracket 432 and rotated. The second bracket 432 may stably support the rotation shaft 421. The rotation shaft holder 422a of the first shaft holder 422 may be coupled to the rolled upper side of the second bracket 432. The rotation shaft holder 422a may surround the rolled upper side of the second bracket 432. The rotation shaft 421 may be inserted into the rolled one side of the first bracket 432 and rotated. The first bracket 431 may stably support the rotation shaft 421.

Figure 40:
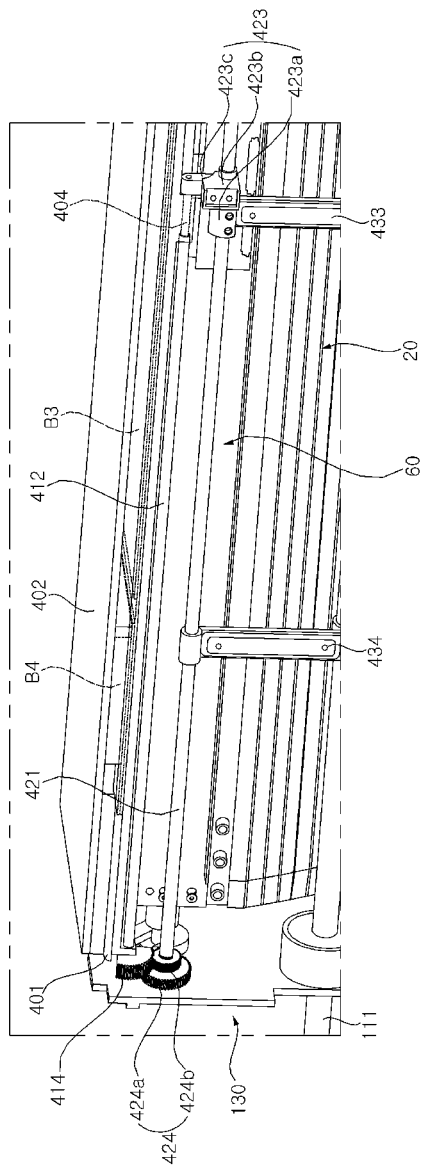
Figure 41:
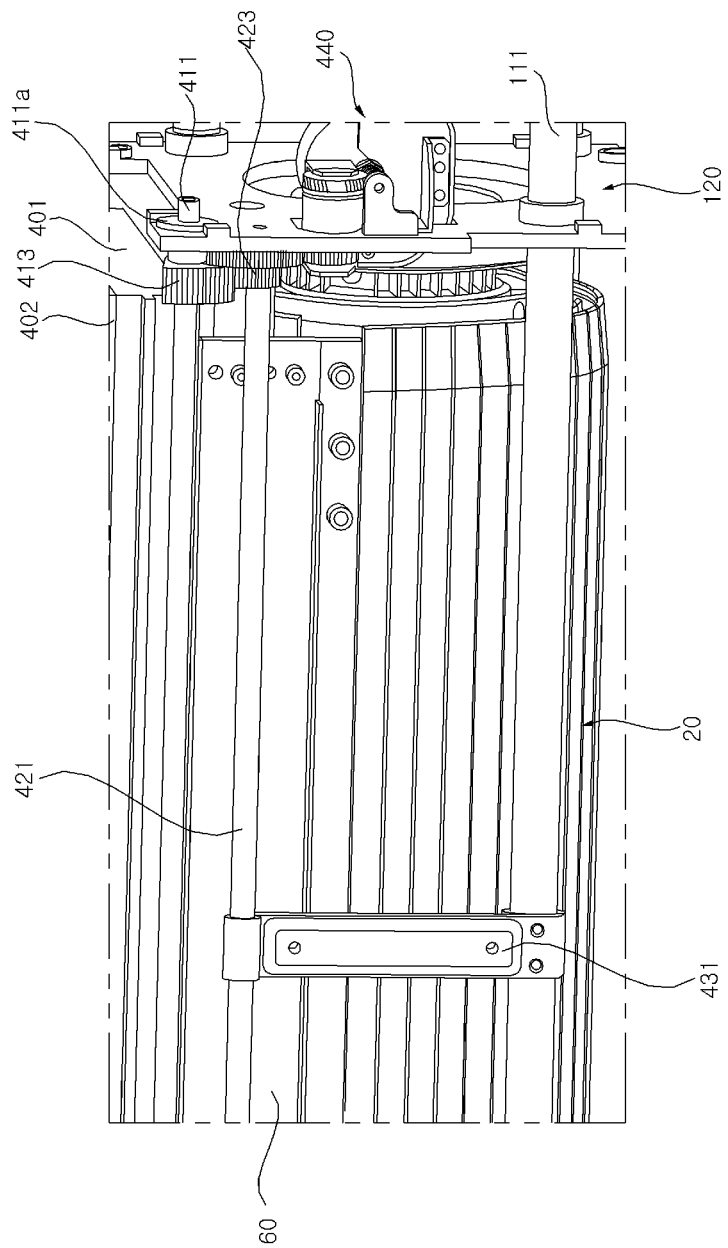
Figure 42:
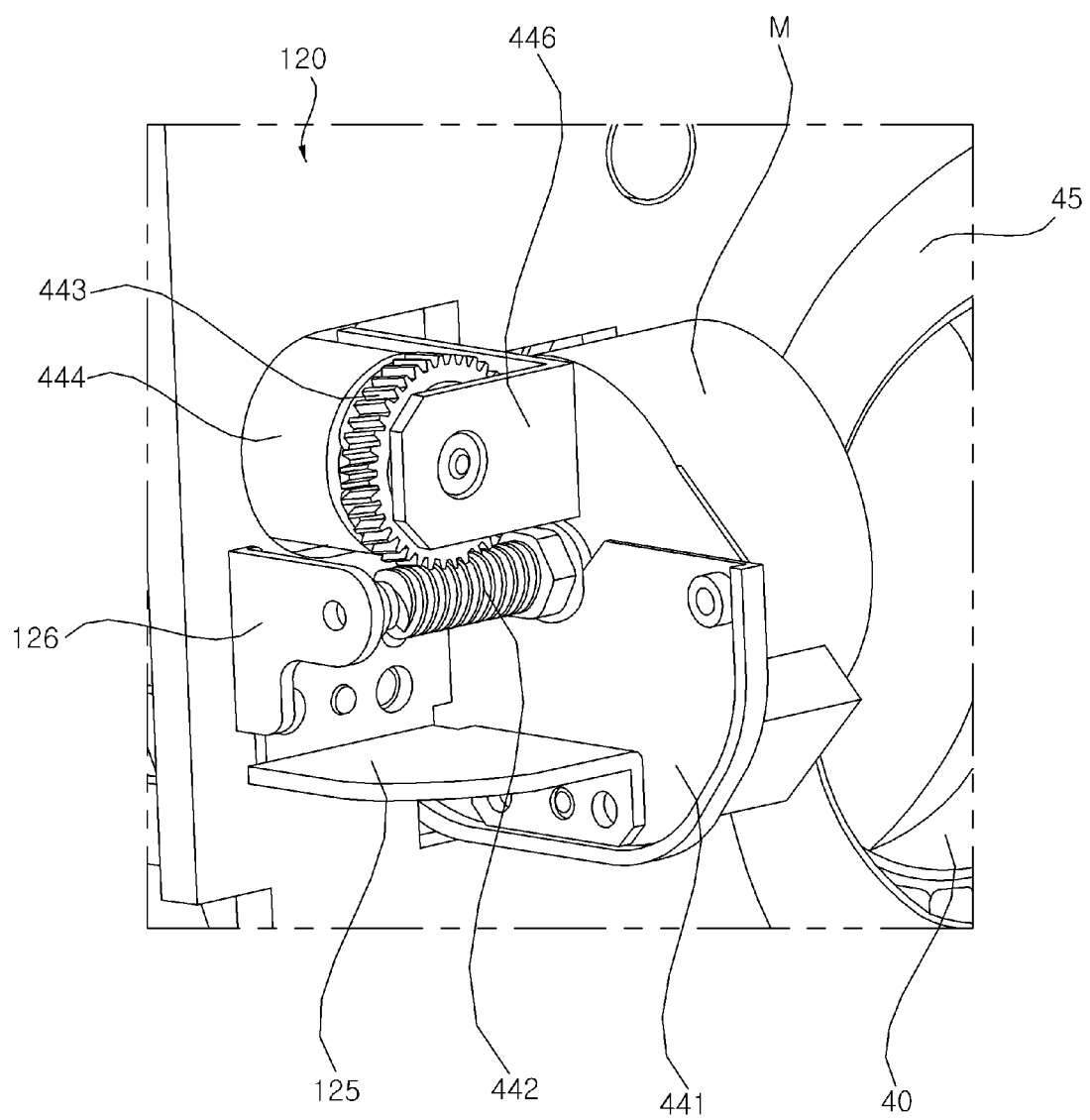

Referring to FIGS. 40 to 42, a second door shaft 412 may be coupled to the door 400. The second door shaft 412 may be located adjacent to the lower edge of the long side of the door 400. The second door shaft 412 may have one end coupled to the door 400 and the other end coupled to the second frame 130. The other end of the second door shaft 412 may be inserted into the second frame 130 and rotate with respect to the second frame 130.

The door 400 may include a second shaft coupling portion 404. The second shaft coupling portion 404 may be formed in the long side of the storage case 401 of the door 400. The second door shaft 412 may be inserted into and fixed to the second shaft coupling portion 404. The second door shaft 412 may be a hollow pipe. The second door shaft 412 may be inserted into a second door gear 414. The second door gear 414 may face or contact the inner surface of the second frame 130. The second door gear 414 may be fixed to the second door shaft 412 and rotate together with the second door shaft 412.

A second shaft holder 423 may be coupled to the third bracket 433 and the second door shaft 412. The second shaft holder 423 may include a body 423b, a door shaft holder 423c, and a rotation shaft holder 423a. The other side of the second door shaft 412 may be fixed to the second shaft coupling portion 404, may be inserted into the door shaft holder 423c, and may rotate in the door shaft holder 423c. The door shaft holder 423c may be formed to protrude from one side of the body 423b. The rotation shaft holder 423a of the second shaft holder 423 may be connected to the upper side of the third bracket 433.

One side of the elongated third bracket 433 may be rolled. The rotation shaft 421 may be inserted into the rolled one side of the third bracket 433 and rotated. The third bracket 433 may stably support the rotation shaft 421. The rotation shaft holder 423a of the second shaft holder 423 may be coupled to the rolled upper side of the third bracket 433. The rotation shaft holder 423a may surround the rolled upper side of the third bracket 433. The rotation shaft 421 may be inserted into the rolled one side of the fourth bracket 434 and rotated. The fourth bracket 434 may stably support the rotation shaft 421.

Figure 43:
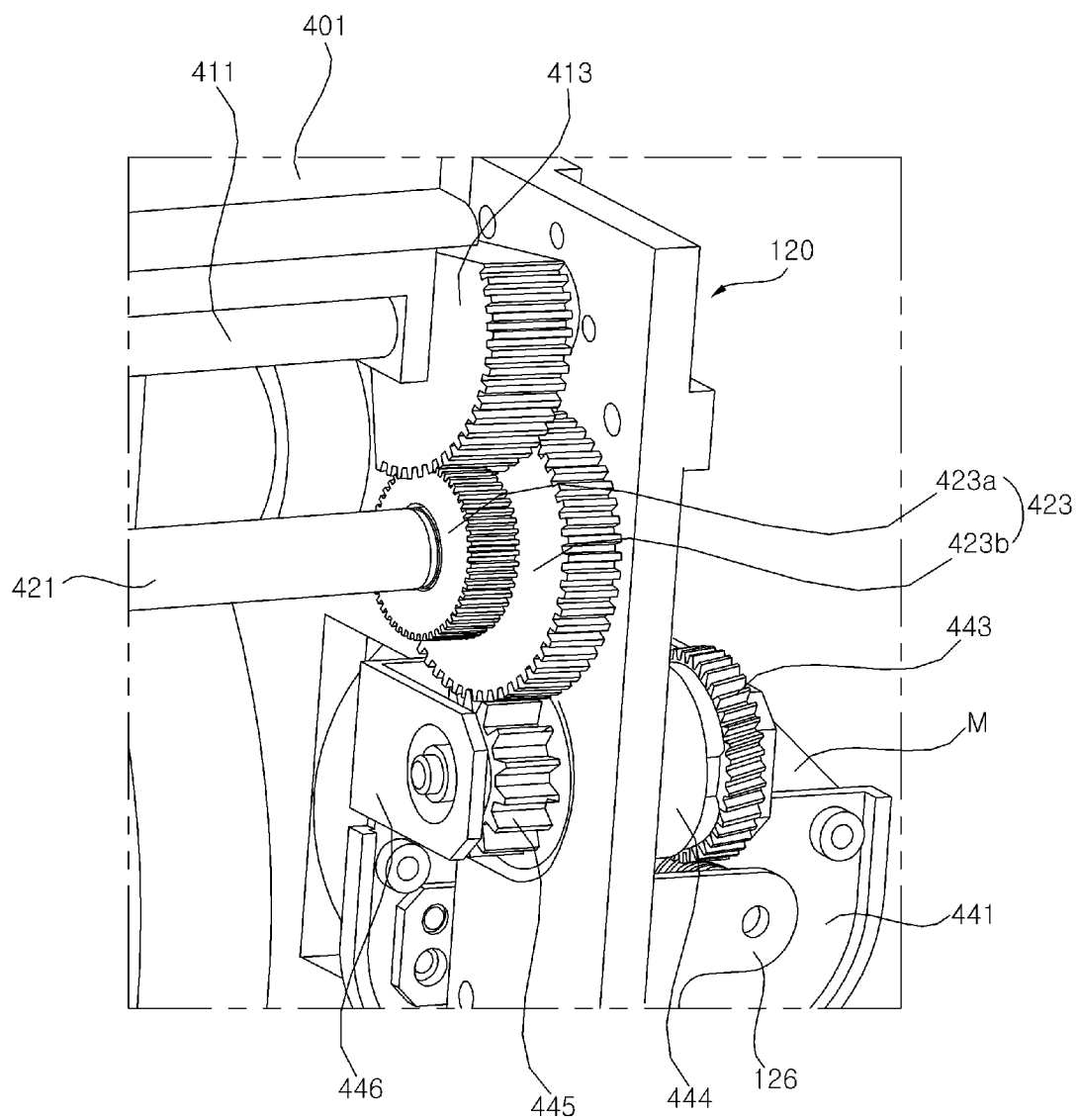
Figure 44:
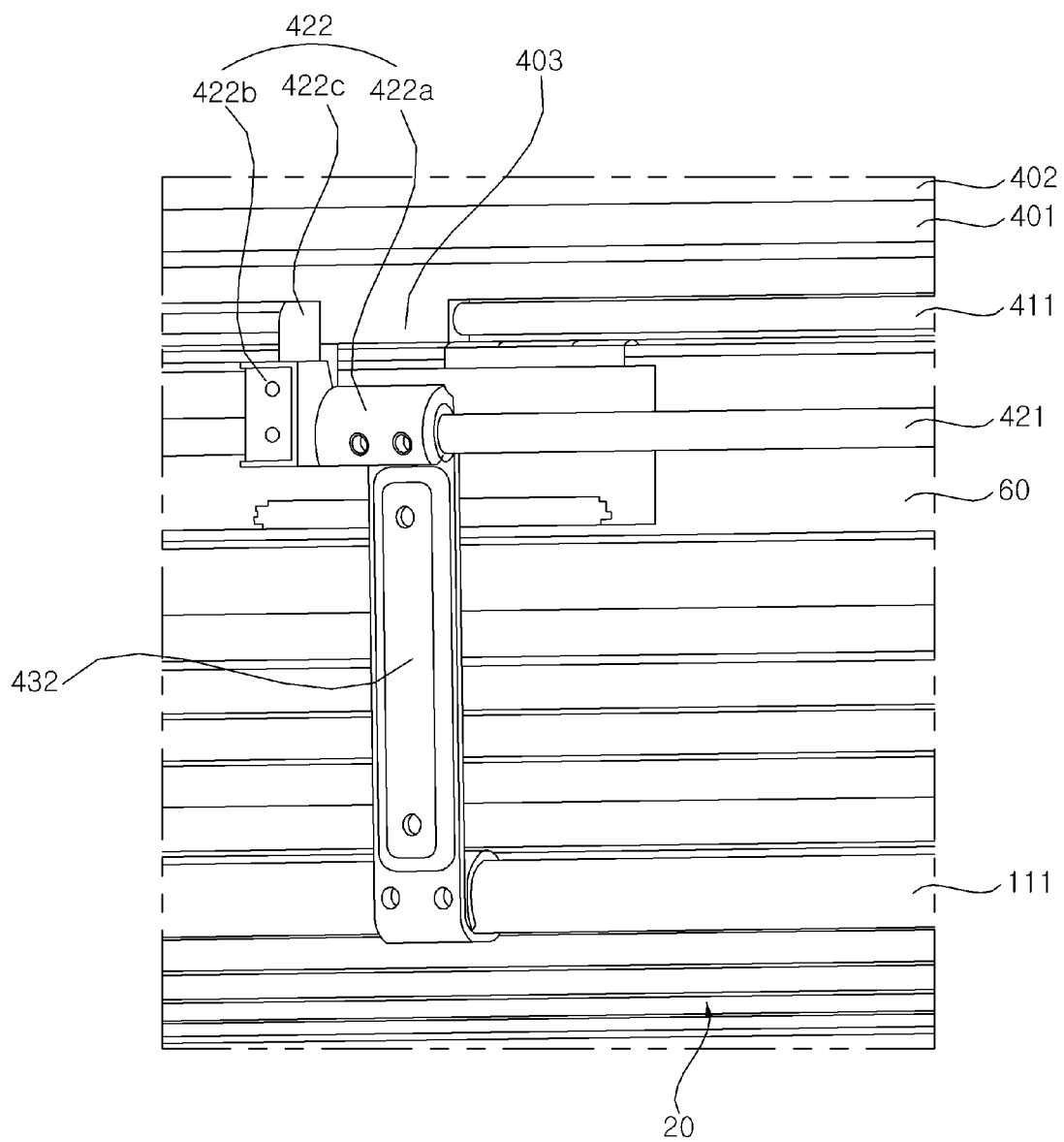
Figure 45:
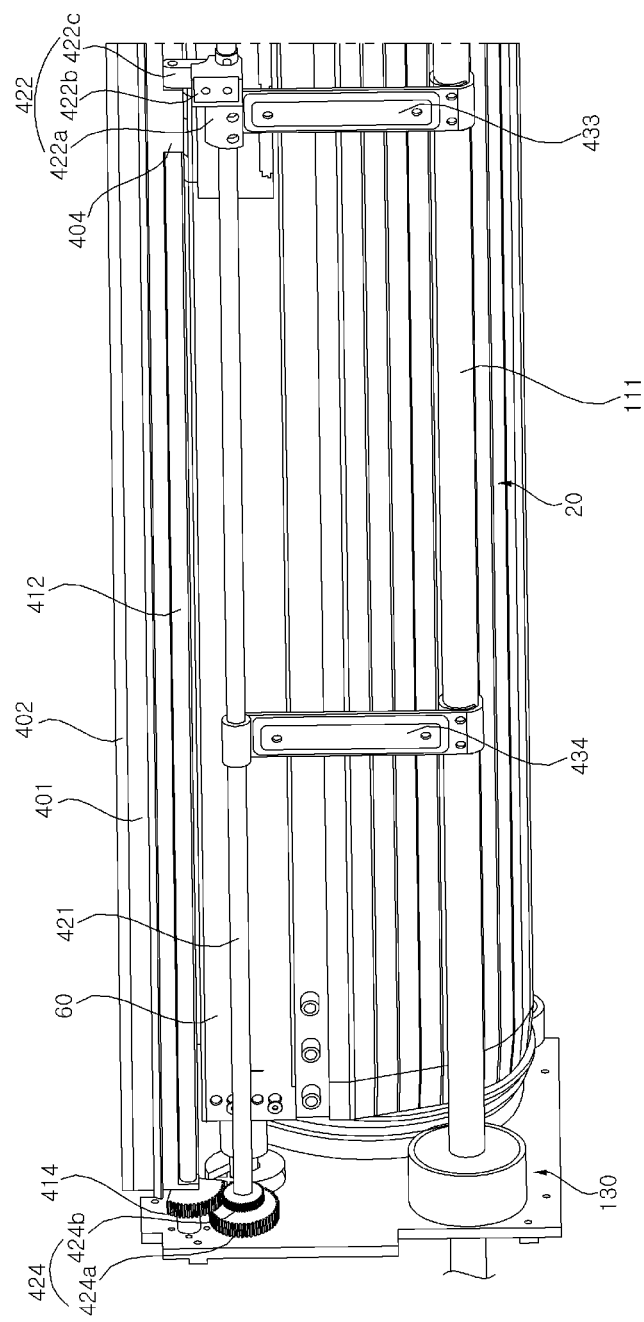

Referring to FIGS. 43 to 45, a door driving assembly 440 may be installed in the first frame 120. The door driving assembly 440 may include a motor M, a worm 442, a first gear 443, a torque limiter 444, a second gear 445, and a third gear 423.

A motor bracket 125 may be fixed to the outer surface of the first frame 120. A motor fixing plate 441 may be fixed to the motor bracket 125. The motor M may be fixed to the motor fixing plate 441. The worm 442 may be fixed to the rotation shaft of the motor M. The motor M may rotate the worm 442.

A worm bracket 126 may be fixed to the outer surface of the first frame 120 while being adjacent to the motor bracket 125. The worm 442 may be rotatably installed in the worm bracket 126. A gear bracket 446 may be fixed to the first frame 120 by penetrating the inner and outer surfaces of the first frame 120. For example, the gear bracket 446 may have a U-shape as a whole. The first gear 443, the torque limiter 444, and the second gear 445 may be mounted in the gear bracket 446.

The first gear 443 may be engaged with the worm 442. When the worm 442 rotates, the first gear 443 may be engaged with the worm 442 to rotate. The second gear 445 may be interlocked with the rotation of the first gear 443. The torque limiter 444 may be installed between the first gear 443 and the second gear 445. The torque limiter 444 may limit the torque transmitted by the first gear 443 to the second gear 445 to a certain level.

The rotation shaft 421 may be inserted into the third gear 423. The third gear 423 may be fixed to the rotation shaft 421. The third gear 423 may include an outer gear 423b and an inner gear 423a. The diameter of the outer gear 423b may be larger than the diameter of the inner gear 423a. The outer gear 423b may be engaged with the second gear 445, and the inner gear 423a may be engaged with the first door gear 413. The driving force provided by the motor M may be transmitted to the first door gear 413.

Figure 46:
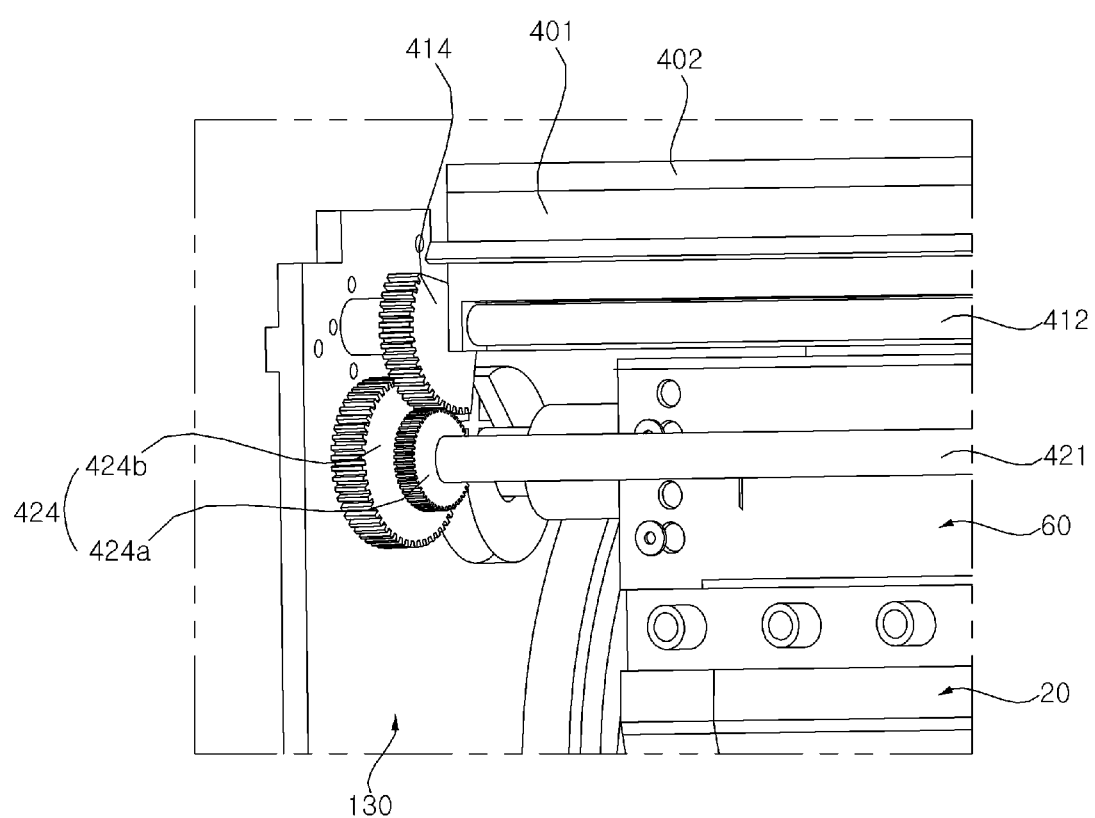
Figure 47:
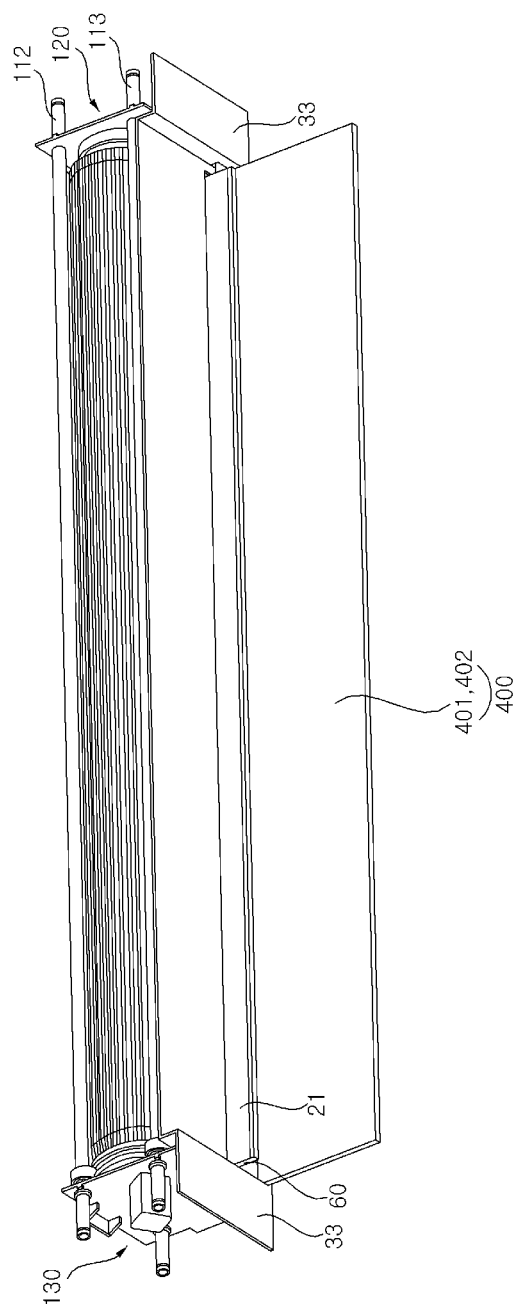

Referring to FIGS. 43, 46 and 47, a fourth gear 424 may be engaged with the second door gear 414. The rotation shaft 421 may be inserted into the fourth gear 424. The fourth gear 424 may include an outer gear 424b and an inner gear 424a. The diameter of the outer gear 424b may be larger than the diameter of the inner gear 424a. The inner gear 424a may be engaged with the second door gear 414. The outer gear 424b may be engaged with the second door gear 414.

The door gears 413, 414 may be rotated while the rotation shaft 421 is rotated by the driving force provided by the motor M. When the door gears 413, 414 rotate, the door 400 may be opened or closed by rotating while the door shafts 411 and 412 rotate. When the door 400 is opened, the display panel 21 and/or the module cover 23 may descend.

According to an aspect of the present disclosure, provided is a display device including: a flexible display panel; a roller which extends long, and around which the display panel is wound, or from which the display panel is unwound; a first frame to which one end of the roller is rotatably coupled; a second frame to which the other end of the roller is rotatably coupled, and which faces the first frame with respect to the roller; and a door assembly which is located adjacent to a distal end of the display panel unwound from the roller, and is pivotally connected to the first frame and the second frame.

In addition, according to another aspect of the present disclosure, the door assembly includes: a storage case which is pivotably connected to the first frame and the second frame, and in which at least one control board is received; and a cover which is coupled to the storage case, and covers the at least one control board.

In addition, according to another aspect of the present disclosure, the door assembly further includes: a first door shaft which extends long along a long side of the storage case, has one side fixed to a first shaft coupling portion formed in the long side of the storage case, and has the other side rotatably coupled to the first frame; and a second door shaft which extends long along the long side of the storage case, has one side fixed to a second shaft coupling portion formed in the long side of the storage case, and has the other side rotatably coupled to the second frame.

In addition, according to another aspect of the present disclosure, the first shaft coupling portion and the second shaft coupling portion are located between the first door shaft and the second door shaft.

In addition, according to another aspect of the present disclosure, the door assembly further includes: a first door gear into which the other side of the first door shaft is inserted, and which rotates together with the first door shaft; and a second door gear into which the other side of the second door shaft is inserted, and which rotates together with the second door shaft.

In addition, according to another aspect of the present disclosure, the door assembly includes: a rotation shaft which is parallel to the first door shaft and the second door shaft, and rotatably coupled to the first frame and the second frame; and a first gear which is engaged with the first door gear, and is inserted into the rotation shaft and rotates together with the rotation shaft; and a second gear which is engaged with the second door gear, and is inserted into the rotation shaft and rotates together with the rotation shaft.

In addition, according to another aspect of the present disclosure, the door assembly further includes: a third gear engaged with the first gear; and a motor which is coupled to the first frame, and provides a rotational force to the third gear.

In addition, according to another aspect of the present disclosure, the door assembly further includes a torque limiter installed between the third gear and the motor.

In addition, according to another aspect of the present disclosure, the display device further includes: a guide roller which extends long in a length direction of the rotation shaft, faces the rotation shaft with respect to the display panel unwound from the roller, and is coupled to the first frame and the second frame; a pipe which extends long in a length direction of the guide roller, and is coupled to the first frame and the second frame; and a bracket connecting the pipe and the rotation shaft, wherein the rotation shaft further includes a bracket rotating in the bracket.

In addition, according to another aspect of the present disclosure, the display device further includes: a shaft holder connecting the bracket and the first door shaft, wherein the shaft holder includes: a rotation shaft holder surrounding the bracket on which the rotation shaft rotates; and a door shaft holder which is located adjacent to the first shaft coupling portion, and into which the first door shaft is rotatably inserted.

In addition, according to another aspect of the present disclosure, the display device further includes: a module cover which extends long in a length direction of the roller, and has a plurality of segments sequentially arranged in an up-down direction of the display panel at a rear surface of the display panel, wherein the display panel and the module cover are wound around or unwound from the roller.

In addition, according to another aspect of the present disclosure, the display panel descends while unwinding from the roller, and ascends while being wound around the roller.

Certain embodiments or other embodiments of the invention described above are not mutually exclusive or distinct from each other. Any or all elements of the embodiments of the invention described above may be combined or combined with each other in configuration or function.

For example, a configuration "A" described in one embodiment of the invention and the drawings and a configuration "B" described in another embodiment of the invention and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
   a flexible display panel;
   a roller which extends in a long direction, and around which the flexible display panel is wound, or from which the flexible display panel is unwound;
   a first frame to which a first end of the roller is rotatably coupled;
   a second frame to which a second end of the roller is rotatably coupled, and which faces the first frame with respect to the roller; and
   a door assembly which is located adjacent to a distal end of the flexible display panel when the flexible display panel is unwound from the roller, and is pivotally connected to the first frame and the second frame,
   wherein the door assembly comprises:
   a storage case which is pivotably connected to the first frame and the second frame;
   a first door shaft which extends in the long direction along a long side of the storage case, has a first side fixed to a first shaft coupling portion formed in the long side of the storage case, and has a second side rotatably coupled to the first frame;
   a second door shaft which extends in the long direction along the long side of the storage case, has a first side fixed to a second shaft coupling portion formed in the long side of the storage case, and has a second side rotatably coupled to the second frame;
   a first door gear into which the second side of the first door shaft is inserted, and which rotates together with the first door shaft; and
   a second door gear into which the second side of the second door shaft is inserted, and which rotates together with the second door shaft.

2. The display device of claim 1, wherein the door assembly further comprises:
   a cover which is coupled to the storage case, and which covers the at least one control board.

3. The display device of claim 1, wherein the first shaft coupling portion and the second shaft coupling portion are located between the first door shaft and the second door shaft.

4. The display device of claim 1, wherein the door assembly comprises:
- a rotation shaft which is parallel to the first door shaft and the second door shaft, and rotatably coupled to the first frame and the second frame; and
- a first gear which is engaged with the first door gear, and is inserted into the rotation shaft and rotates together with the rotation shaft; and
- a second gear which is engaged with the second door gear, and is inserted into the rotation shaft and rotates together with the rotation shaft.

5. The display device of claim 4, wherein the door assembly further comprises:
- a third gear engaged with the first gear; and
- a motor which is coupled to the first frame, and provides a rotational force to the third gear.

6. The display device of claim 5, wherein the door assembly further comprises a torque limiter installed between the third gear and the motor.

7. The display device of claim 4, further comprising:
- a guide roller which extends in the long direction in a length direction of the rotation shaft, faces the rotation shaft with respect to the flexible display panel unwound from the roller, and is coupled to the first frame and the second frame;
- a pipe which extends in the long direction in a length direction of the guide roller, and is coupled to the first frame and the second frame; and
- a bracket connecting the pipe and the rotation shaft,
- wherein the rotation shaft further comprises a bracket rotating in the bracket.

8. The display device of claim 7, further comprising a shaft holder connecting the bracket and the first door shaft, wherein the shaft holder comprises:
- a rotation shaft holder surrounding the bracket on which the rotation shaft rotates; and
- a door shaft holder which is located adjacent to the first shaft coupling portion, and into which the first door shaft is rotatably inserted.

9. The display device of claim 1, further comprising a module cover which extends in the long direction in a length direction of the roller, and has a plurality of segments sequentially arranged in an up-down direction of the flexible display panel at a rear surface of the flexible display panel,
wherein the flexible display panel and the module cover are wound around or unwound from the roller.

10. The display device of claim 1, wherein the flexible display panel descends while unwinding from the roller, and ascends while being wound around the roller.

* * * * *